United States Patent [19]
Meyrueix et al.

[11] Patent Number: 5,272,434
[45] Date of Patent: Dec. 21, 1993

[54] METHOD AND APPARATUS FOR ELECTRO-OPTICALLY TESTING CIRCUITS

[75] Inventors: Paul Meyrueix, Paris; Gerard Tremblay, Loudin, both of France; Jean P. Vernhes, San Jose, Calif.

[73] Assignee: Schlumberger Technologies, Inc., San Jose, Calif.

[21] Appl. No.: 630,421

[22] Filed: Dec. 18, 1990

Related U.S. Application Data

[63] Continuation of Ser. No. 226,127, Jul. 29, 1988, abandoned.

[30] Foreign Application Priority Data

| Jun. 20, 1987 | [FR] | France | 88 08230 |
| Jul. 31, 1987 | [FR] | France | 87 10870 |
| Jul. 22, 1988 | [EP] | European Pat. Off. | 88/401901.9 |

[51] Int. Cl.$^5$ ............................................. G01R 31/22
[52] U.S. Cl. .................................. 324/158 R; 324/96; 324/73.1
[58] Field of Search ............... 324/500, 523, 96, 77 K, 324/158 F, 158 D, 501, 76.1; 350/356, 396, 390, 340, 96.11; 359/245, 247, 254, 257, 315, 318, 298, 263; 356/400

[56] References Cited

U.S. PATENT DOCUMENTS

| 3,449,583 | 6/1969 | Eden ................................... 359/263 |
| 3,934,199 | 1/1976 | Channin ........................ 324/158 R |

(List continued on next page.)

FOREIGN PATENT DOCUMENTS

| 0021967 | 6/1980 | European Pat. Off. |
| 0047162 | 8/1981 | European Pat. Off. |
| 0297562 | 6/1988 | European Pat. Off. |
| 0299432 | 7/1988 | European Pat. Off. |
| 0284771 | 10/1988 | European Pat. Off. |
| 0293788 | 12/1988 | European Pat. Off. |
| 0293840 | 12/1988 | European Pat. Off. |
| 0293841 | 12/1988 | European Pat. Off. |
| 0293842 | 12/1988 | European Pat. Off. |
| 0293922 | 12/1988 | European Pat. Off. |
| 0295413 | 12/1988 | European Pat. Off. |
| 2617977 | 1/1989 | France. |
| 8302829 | 8/1983 | World Int. Prop. O. |

OTHER PUBLICATIONS

John Hiatt; "A Method of Detecting Hot Spots on Semiconductors Using Liquid Crystal"; IEEE/Proc. IRPS; 1981; pp. 130–133.

(List continued on next page.)

*Primary Examiner*—Vinh Nguyen
*Attorney, Agent, or Firm*—Skjerven, Morrill, MacPherson, Franklin & Friel

[57] ABSTRACT

Electro-optical in-circuit testing, especially of large circuits such as those assembled on printed circuit boards, is achieved in an automatic test system by disposing an electro-optical sensor in proximity to the circuit conductors, applying test signals to the circuit under test, and measuring an optical property of the sensor at selected regions thereof corresponding to internal nodes, i.e. test points, of the circuit. The sensor may be an optical probe, having a lens and a layer of electro-optical material which is adapted to be applied to the circuit. The electro-optical material may be either a polymer film or a crystal, the latter requiring a flexible coupling medium on the face applied to the circuit under test. The electro-optical material is provided with a reflective coating on one surface to facilitate a polarimetric measurement made transverse to the plane of the material. Another type of optical probe has a layer of electro-optical material with electrodes on the surface opposite the surface applied to the circuit under test. A polarimetric measurement is made by suitably biasing the electrodes and detecting light that passes through the material parallel to its surfaces. In another type of optical probe, the electro-optical material is coated on both surfaces, one coating being highly reflective and the other being semi-transparent. An interferometric measurement is provided by this type of sensor. Moreover, the polymer film may be applied directly to the printed circuit board during manufacture, in which case the lens is brought into contact with the electro-optical material during circuit testing.

52 Claims, 13 Drawing Sheets

U.S. PATENT DOCUMENTS

| | | | |
|---|---|---|---|
| 3,990,770 | 11/1976 | Carl et al. | 350/390 |
| 4,105,298 | 8/1978 | Levine et al. | 350/340 |
| 4,147,979 | 4/1979 | Baues et al. | 324/96 |
| 4,242,635 | 12/1980 | Burns | 324/73 R |
| 4,269,481 | 5/1981 | Yeh et al. | 350/356 |
| 4,333,051 | 6/1982 | Goodman | 324/158 D |
| 4,355,278 | 10/1982 | Burns et al. | 324/501 |
| 4,446,425 | 5/1984 | Valdmanis et al. | 324/77 |
| 4,603,293 | 7/1986 | Mourou et al. | 324/96 |
| 4,618,819 | 10/1986 | Mourou et al. | 324/96 |
| 4,642,560 | 2/1987 | Morille et al. | 324/158 F |
| 4,681,449 | 7/1987 | Bloom et al. | 356/364 |
| 4,779,961 | 10/1988 | DeMartino | 350/356 |
| 4,841,234 | 6/1989 | Aoshima et al. | 350/376 |
| 4,870,356 | 9/1989 | Tingley | 324/158 F |
| 4,877,298 | 10/1989 | Teng et al. | 350/356 |
| 4,891,579 | 1/1990 | Aoshima et al. | 324/96 |
| 4,891,584 | 1/1990 | Kamieniecki et al. | 324/158 D |
| 4,906,922 | 3/1990 | Takahashi et al. | 324/96 |
| 4,910,454 | 3/1990 | Williamson | 324/77 K |
| 4,920,310 | 4/1990 | Aoshima et al. | 324/96 |
| 4,923,288 | 5/1990 | Allen et al. | 350/356 |
| 4,999,577 | 3/1991 | Beha et al. | 324/96 |
| 5,090,824 | 2/1992 | Nelson et al. | 250/227.14 |

OTHER PUBLICATIONS

Giannini et al.; "Liquid Crystal Technique for Field Detection in Microwave Integrated Circuitry"; Alta Freg. (Italy), vol. 46, No. 4; Apr. 1977.

Zhu, Z. H. et al., "New measurement technique: CW electro-optic probing of electric fields," *Applied Physics Letters*, vol. 49, No. 8, pp. 432-434, 1986.

A. Hurty et al., "How the Active Matrix LCD Works," Macworld, Nov. 1989, p. 147.

IEEE Journal of Quantum Electronics, vol. QE-19, No. 4, Apr. 1983, pp. 664-667, US; J. A. Valdmanis et al.: "Subpicoseond electrical sampling".

Herts Stevenage, "Noncontact Electro-Optic Sampling With a GaAs Injection Laser", Aug. 14, 1986, vol. 22, No. 17, pp. 918-919.

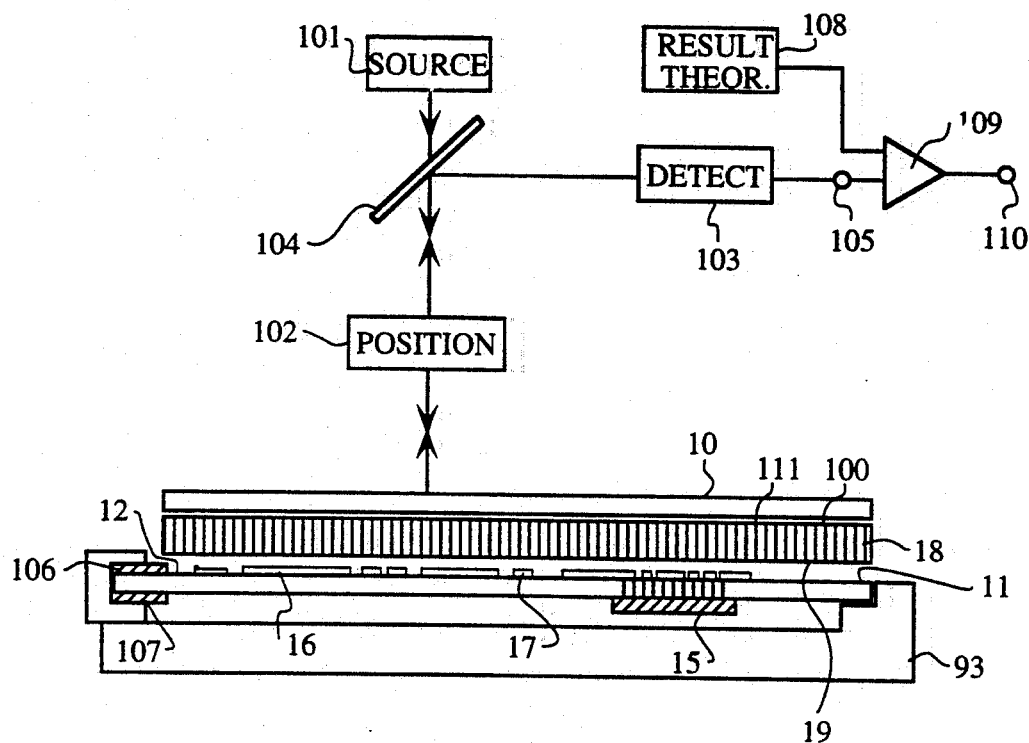
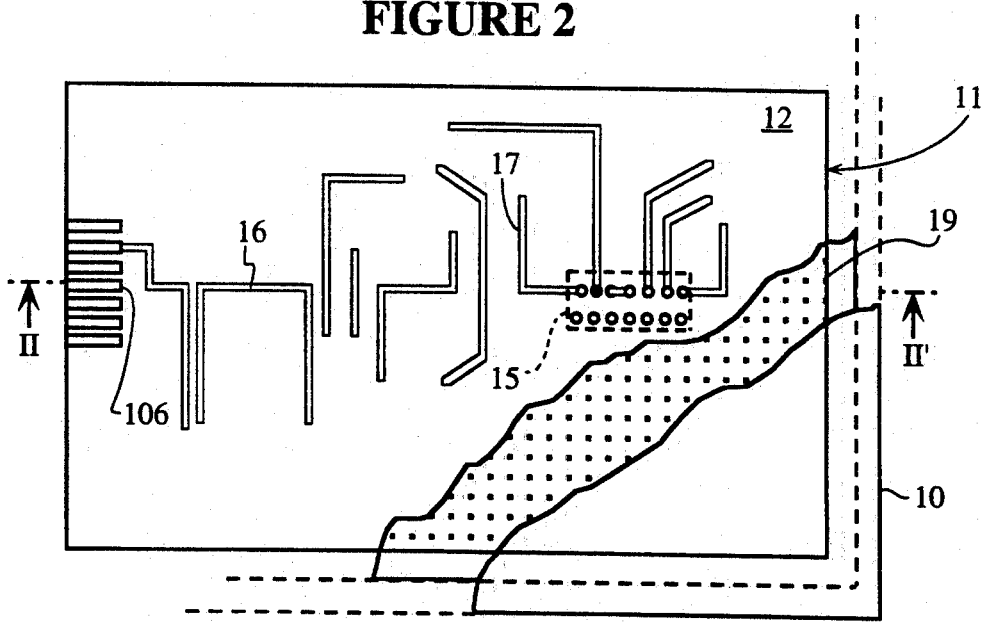

(PHI) = 2 (PI/lambda) n•e

METHOD AND APPARATUS FOR ELECTRO-OPTICALLY TESTING CIRCUITS

This application is a continuation of application Ser. No. 07/226,127, filed Jul. 29, 1988, now abandoned.

BACKGROUND OF THE INVENTION

1. Field of the Invention

The present invention relates to circuit testing, and more particularly to the testing of circuits using electro-optical means.

2. Description of Related Art

Circuit testing is performed automatically by apparatus which makes contact with the circuit nodes, applies excitation signals to these nodes, and monitors the response signals produced by the tested circuit. Such apparatus is often called in the art "Automatic Test Equipment" (abbreviated as ATE).

ATE may be classified into two types, namely functional testers and in-circuit testers. In a functional tester, inputs are applied and outputs received only at the normal input and output nodes of the circuit, such as for example an edge connector for a board mounted circuit. Input signals are applied and output signals are monitored to assess the functionality of the circuit assembly as a whole.

A disadvantage of functional testers, particularly where complex circuits are involved, is that a large number of input/output combinations (referred to in the art as test patterns) are required to fully exercise the circuit, and an exhaustive test may be very lengthy. A further problem is that it may be impossible to test some circuit components, notably digital memories and counters, since certain states of such devices cannot be controlled from externally accessible nodes alone. For example, there may be no external connection to the reset input of a counter. Equally, some output conditions of some circuits may not be externally distinguishable. For these reasons, some circuit assemblies can be only partially tested with a functional tester.

On the other hand, in-circuit testers have the advantage of being able to test each component of a board mounted circuit individually, since they are designed to contact internal circuit nodes, that is nodes other than the external input and output nodes. However this advantage is obtained at the expense of a special piece of hardware, referred to in the art as a "bed of nails" fixture, comprising a plurality of spring loaded probes, positioned individually to contact nodes within a circuit. By this means component inputs and outputs may be driven and measured to establish the functionality of each component individually.

One disadvantage of in-circuit testers is the hardware required in providing a fixture adapted to each circuit to be tested, for example each board, and means for holding the board in place and in contact with the fixture. A less apparent disadvantage is possible damage to circuit devices when an output of a device is driven via a nail to a state other than that which would logically result from the signals at its inputs in order to test another device having an input connected to that output. Such backdriving, as such a circumstance is referred to in the art, can damage the backdriven device by, for example, causing excessive heating therein. Further, the miniaturization of circuits increases the difficulty of accessing the internal nodes of the circuit under test. Moreover, in-circuit testers are intrinsically poorly adapted to monitor the overall functioning of a circuit, notably those which interfere with the respective timing of signals produced by the various components.

It is nevertheless desirable that automatic circuit testing be able to provide contemporaneously analytic information allowing validation of the functionality of the components taken individually, and further derived information allowing validation of the global functionality of the circuit, which depends not only on the functionality of each component, but also on the interactions between components. Generally, in-circuit testers give priority to the first aspect to the detriment of the second, while functional testers do essentially the opposite.

Functional testing may include a "diagnostic phase," a delicate operation for isolating the probable cause of a fault. It is generally impossible to locate some faults by exercising external inputs and monitoring external outputs alone, since there will not be a unique test pattern corresponding to every possible fault. This problem is to some extent overcome in some functional testers by providing a manual probe for use during the diagnostic phase on boards which have failed the functional test. During the diagnostic phase, an operator places the probe at various nodes of the circuit in such a way that an internal node may be monitored in a way somewhat similar to that in which it would be monitored by an in-circuit tester. Such a procedure is slow and necessitates a skilled operator, however.

The use of electro-optical materials for non-contact monitoring of electrical signals has been proposed for integrated circuits in U.S. Pat. No. 4,618,819, which describes a system which uses electro-optical crystals placed physically proximate the surface of a not yet encapsulated integrated circuit. A polarized light beam is directed towards a region of the crystal in the neighborhood of a conductor carrying an electrical signal to be measured, and then reflected. In accordance with well known laws, a characteristic of the reflected light is affected by the electric field around the conductor, such that by appropriate detection of the reflected light, the electric field and the signal which produces it may be detected. Thus an image of the electrical signal in the conductor may be obtained.

Unfortunately, electro-optical systems have not been proposed that are suitable for use in testing circuits other than integrated circuits, such as, for example, hybrid circuits and circuits assembled on printed circuit boards.

SUMMARY OF THE INVENTION

An object of the present invention is to provide an apparatus which provides for electro-optical in-circuit testing of circuits, especially such large circuits as hybrids and circuits assembled on printed circuit boards.

A method for achieving this and other objects comprises the steps of conformably disposing an electro-optical sensor on the surface of the circuit under test, so that electro-optical material within the sensor is exposed to electric fields associated with conductors of the circuit. Test signals are applied to the circuit, whereby an optical property of the electro-optical material is variously affected by signals on the conductors. The optical property is measured at selected regions within the electro-optical material, and a test parameter is determined from the result of the measuring step.

An apparatus for achieving this and other objects comprises sensor means having a conformable surface and including electro-optical material; means for disposing the conformable surface of the sensor on the surface of the circuit, such that the electro-optical material within the sensor is exposed to electric fields associated with the conductors of the circuit; means for applying test signals to the circuit, whereby an optical property of the electro-optical material is variously affected by signals on the conductors; means for measuring the optical property at selected positions within the electro-optical material; and means responsive to the measuring means for determining a test parameter.

An embodiment of an interface apparatus for achieving this and other objects comprises a layer of electro-optical material having a reflective coating upon one of two opposing surfaces, the other surface being transparent to polarized light; and a flexible coupling medium affixed to the coated surface of the electro-optical material along one of the opposing surfaces thereof, the unaffixed opposing surface of said coupling medium being adapted to be urged against the surface of the circuit.

Another such embodiment comprises a layer of an electro-optical polymer having a reflective coating upon one of two opposing surfaces, said coated surface being adapted to be applied against said circuit surface, and the other surface being transparent to polarized light;

Another such embodiment comprises a layer of electro-optical material having a plurality of discrete electrodes upon one of two opposing surfaces, the other surface being adapted to be urged against said circuit surface; said electro-optical material further having one end adapted to receive polarized light along an axis parallel to said opposing surfaces, and another end opposite said first adapted for furnishing said polarized light to a plurality of receivers.

Another embodiment for achieving this and other objects comprises a layer of an electro-optical material having a reflective coating upon two opposing surfaces, one of said coated surfaces being semitransparent to incident polarized light, and the other of said coated surfaces being highly reflective and adapted to be applied to said circuit surface.

BRIEF DESCRIPTION OF THE DRAWINGS

In the drawings, where like reference numerals indicate like parts:

FIG. 1 represents an embodiment of ATE in accordance with the invention;

FIG. 2 represents parts of the equipment of FIG. 1;

DESCRIPTION OF THE PREFERRED EMBODIMENTS

Figure 3:
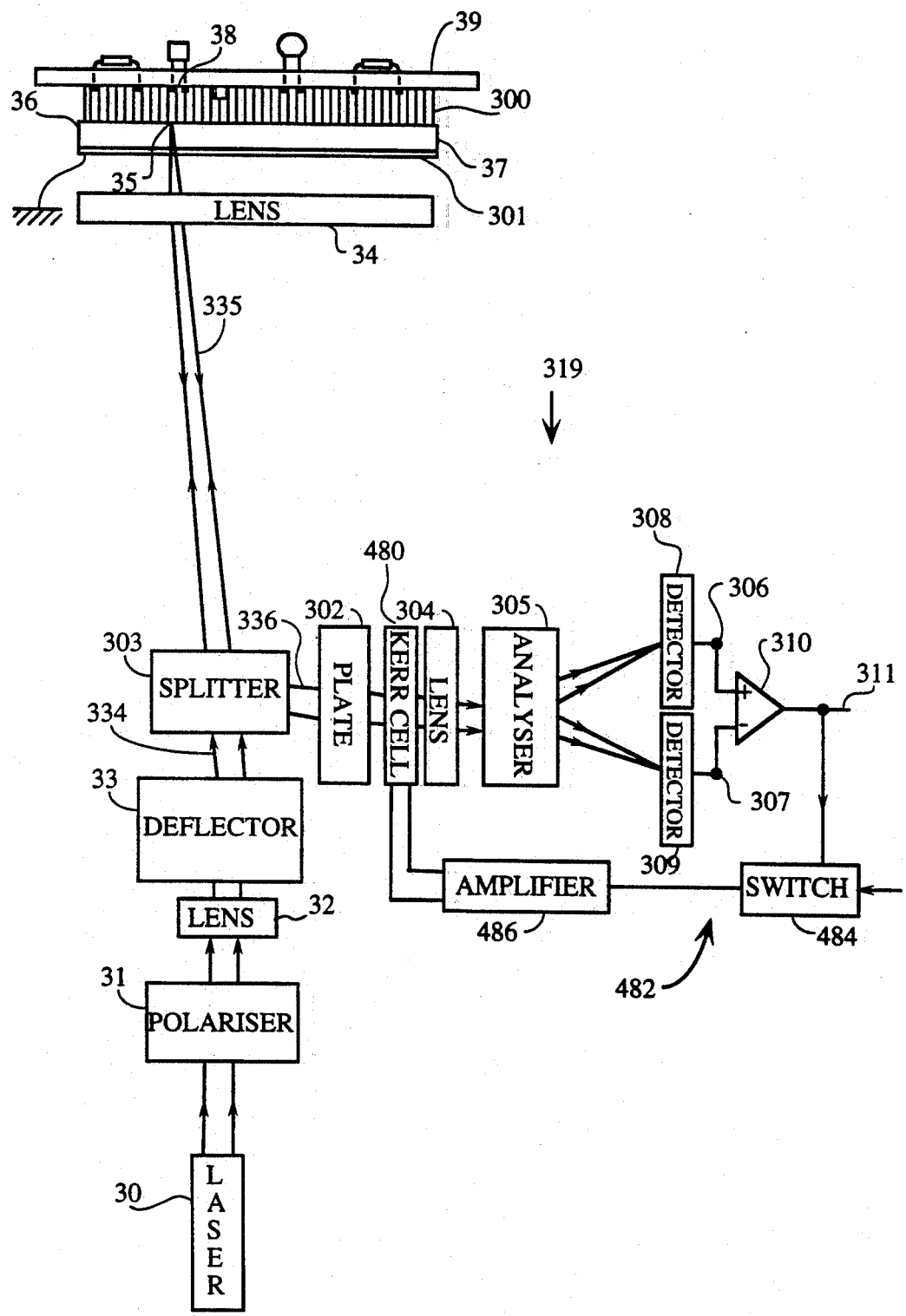
FIG. 3 represents an optical assembly.

In accordance with the invention automatic test equipment includes (FIG. 1) a layer 10 of electro-optical medium of dimensions substantially equal to those of an assembled circuit, such as a printed circuit board 11 to be tested, the assembly being combined such that the electro-optical medium is electrically proximate the surface 12 of the board 11 which carries the electric circuit, the latter comprising components such as 15. The surface 12 carries conductors such as 16 and 17 which interconnect the components, and constitute the nodes of the circuit. The medium 10 may be placed electrically proximate the surface 12 by the intermediary of an interface element 18 which serves to transfer to its upper surface 100 (in the arrangement of FIG. 1) the electrical potentials that appear at its lower surface 19.

In use, the lower surface 19 is in contact with the printed circuit board, while the upper surface 100 is in contact with the medium 10.

Light from a source 101 may be directed at and received from any region of the board surface 12 via positioning means 102, received light being directed toward a detector 103 by virtue of a beam splitter 104 such as a semi-transparent plate.

The detector 103 is sensitive to changes in the optical characteristics of the medium 10 which are induced by electric field variations in the neighbourhood of the region of incidence of light on the medium 10, in such a way as to produce an analogue of this field, adopting the form of an electrical signal at the output 105 of this detector, this signal therefore being also representative of any electrical signal which is present on the conductor the potential of which has been transmitted to the electro-optical medium, in the region of incidence of the light, by the interface member 18.

The board 11 has lengthwise connectors, such as 106 and 107 which are printed on the board and which constitute the external nodes of the circuit, with which it is possible to establish a physical connection via appropriate female connectors of standard type, the use of which is well established in the art. A support or fixture 93, shown schematically, allows manipulation and/or support of the board during a test.

A test pattern may be supplied to exercise the circuit via these external nodes, sufficient to cause a response at the node currently being examined electro-optically, producing an analogue of the response at output 105.

Based upon an analysis of the circuit to be tested, as is the practice in the ATE art, the output expected for the applied test pattern may be predicted in advance, and the prediction 108 used as a basis for comparison, in a comparator 109, with the obtained output 105. If the result of the comparison is that the produced and predicted responses differ, comparator 109 provides an indication of a test failure at its output 110.

It will be appreciated that FIG. 1 is a sectional view taken through a circuit carrying board. To assist the clarity of description, a plan view of the same board, with its conductors (hereinafter called tracks) and an electrical component is shown (FIG. 2), FIG. 1 corresponding to a section being taken at II—II' of FIG. 2. Typically, a circuit board might be 300 mm by 200 mm or more, the electro-optical medium 10 and the relaying member 18 having substantially the same dimensions. The electronic devices such as 15, which are mounted on the board often are digital integrated circuits in dual inline P-dip packages; one part of the track network interconnecting these components is shown in FIG. 2; to the extent that the components are inserted in the lower face of board 11 (in the arrangement of FIG. 1), the component 15, not directly visible, is shown in ghosted marking in FIG. 2, with the exception of its connection pins which, spanning the board to be soldered to the tracks carried by the surface 12 are shown directly in FIG. 2.

The solder pads between the ends of the pins of the components and the tracks constitute important discontinuities in the surface of the board conductor carrying surface. In finished boards, this surface is completely covered with a protective lacquer which forms an intermediate layer of some micro-meters thickness which is between the board conductors and an external test probe. Moreover, these conductors are often in practice covered with oxide which forms during manufacture and storage. This oxide itself is a substance whose existence must be taken into consideration in realising industrial testers.

Lastly, frequently modern printed circuit boards also carry components on the face carrying the conductive track network. Nowadays boards carry tracks and components on both faces.

In use, the interface member 18 is placed in contact with the surface 12 carrying the conductors, as partially shown in FIG. 2. This interface member 18 includes a plurality of conductive columns, such as column 111, arranged in a matrix such that the potential of each conductor may be relayed to the electro-optical medium 10 (also shown in part), via at least one of the conductive columns. The nature and operation of the interface member 18 will be described later.

It will be noted that each of the columns corresponds to a separately observable region of the circuit and that light may be directed at each of them, and received by reflection from each of them. The light is constituted by a polarised light beam from a laser, and the analysis of the reflected light received consists of detection of the rotation of the plane of polarisation, for example by means of a polarimetric assembly including a Wollaston prism separating received light into two detectable beams. The detector in fact comprises two detectors, so as to permit measurement of the difference in intensity between the two beams, and compensation of intensity variations in the source.

The electro-optical medium may be constituted by a crystal. In an alternative, the electro-optical material may be constituted by a polymer film endowed with electro-optical properties. This film may be used in place of an electro-optical crystal layer in the ATE of FIG. 1. It may also be preformed to fit between components of the board to be tested in direct contact with its conductors without recourse to an interface member or only such a member of reduced thickness. As an alternative, the film may be placed directly on the conductor carrying surface before mounting the components and of which the face in contact with the conductors has, intrinsically or from a serigraphic deposition of metallic micro-particles, a degree of light reflectance, for example, the film may be integrated with the printed circuit board as it is made. Such a structure, which allows the interface member to be dispensed with, leads to the making of electronic boards able, by virtue of their fabrication, to be subject to a test benefiting from all the advantages of the invention.

The mechanism by which signals may be detected by an electro-optical effect will now be described in more detail (FIG. 3), more particularly with reference to an embodiment of the invention making use of an interface member. The essential characteristics described being however the same in the case of use of a polymer film.

Output light from a laser 30 (for example an HeNe laser of wavelength 633 mm) is linearly polarised by a polariser 31 and concentrated, by a lens 32, onto an acousto-optical deflector 33, so as to be directed, via a lens 34, toward a point of inspection 35 of a reflective surface 36 of an electro-optical crystal 37. Generally a medium power continuous laser is used, typically 5 to 100 mw.

An acousto-optical deflector 33, known in itself, is controlled by a voltage signal continuously output by a control device of the ATE (not shown), so as to deflect its received light to any point on the electro-optical medium, examination of which is desired.

In a preferred embodiment, the deflector 33 comprises two acousto-optical deflectors placed in series. A first control signal voltage controls beam deflection along a first direction, corresponding for example to one of the dimensions of the board to be tested, and the other voltage signal controls deflection along a second direction, preferably perpendicular to the first and corresponding for example to the other board dimension. Such use of two deflectors allows reduction in the time required to move from one monitoring point 35 to another to a time of the order of some microseconds at most.

The reflective surface 36 has the characteristic that an electrical potential applied to one point on the surface is not propagated to others. Thus, if the reflective qualities of this surface are obtained by a metallic deposition, intrinsically a conductor, the layer would not be continuously metallic but rather comprise a matrix of isolated reflective particles, each of which is however connected to the region of a point to be tested, such as a test point 38 of the board 39, via interface number 300 (directly in the case of a polymer film). In accordance with one possible embodiment, the reflective surface 36 may be formed of an intrinsically isolating material, for example a thin layer of a dielectric material such as an alternating structure of layers of titanium oxide $TiO_2$ and silicon oxide $SiO_2$.

A transparent electrode 301, for example constituted by a deposition of gold or aluminum is deposited as a layer on the first face (that struck by the incident light) of the electro-optical crystal 37, and this electrode is kept at ground potential as a reference: thus, if the electrical potential of the test point under inspection differs from this reference, the polarisation of the reflected light is, by reason of the electric field applied across the thickness of the electro-optical crystal 37, different to that of the incident light, and this difference is detected.

For a cubic crystal structure, such as Bismuth Germanium Oxide Bi4 Ge3 012, the crystal axis (100) of which is optically orientated normal to a quarter wave plate 302, the phase shift of the light due the sustained electro-optical effect is proportional to the potential difference between the faces of the crystal 37 at the monitoring point and independent of the electric field distribution in the crystal.

The reflected light is reflected toward the quarter wave plate 302 via a splitter 303; downstream of the plate 302, the light is directed, by a lens 304, towards a Wollaston analyser 305, from which stem two beams reaching respective photo-electric detectors 308 and 309 which produce respective electrical signals I1 and I2 at their outputs 306 and 307.

This type of polarimetric detection gives the following relationships:

$$I1 = I.(1+m)$$

and $$I2 = I.(1-m).$$

wherein I is an intensity proportional to the luminous intensity of the laser 30 and in which m is the phase lag detected, expressed in radians and implicitly small.

A differential amplifier 310 receiving the signals of outputs 306 and 307 provides at its output 311 a signal I1-I2, thereby equal to 2 Im. In the case where, during a test, the overall luminous intensity variations of the laser 30 correspond to frequencies very much lower than the frequency of variation of m, the value m may be directly obtained by adequate filtering of the electrical signal available at the output 311 of the amplifier 310. As an alternative, a signal I1+I2 may be used to regulate the luminous intensity of the source.

For a crystal of non-cubic structure, such as that of Lithium Nobilium Oxide Li N6 03, the electro-optical effect is also proportional to the potential difference between the faces of the electro-optical crystal. The use of such a crystal requires some care in the case where the coefficient of proportionality between the potential difference and the effect obtained depends upon the orientation of the crystal cut.

The desirable properties of the electro-optical crystal are a low absorption, a low diffusion, and a low circular birefringence and good linearity. Where a highly birefringent material is used, such as Lithium Nobilium Oxide for example, a small variation in the angle of incidence of the light leads to a variation sensitive to static phase. Thermal changes causing crystal thickness variations have similar effects. Preferably, both variations are avoided.

To improve the performance of a highly birefringent material, control of the polarisation of the incident light may, in accordance with the present invention, be provided, for example in response to angle of incidence or temperature. Additionally or alternatively, the apparatus of the invention may include, relative to the electro-optical medium, a crystal structure presenting perpendicular orientations, but thicknesses substantially identical, in such a way as to attenuate or cancel the birefringence.

The electro-optical medium advantageously presents a resistivity at least of the order of 10 ohm.cm, especially for testing low frequency circuits, and a dielectric constant at most of the order of 100 so as to introduce only a low capacitance (1 pf or less).

Figure 4:
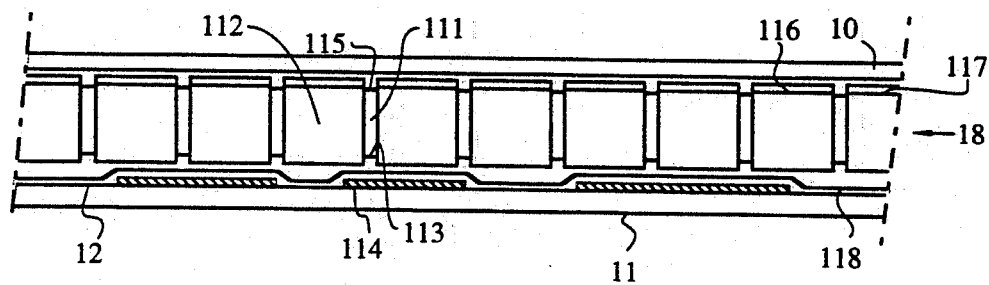
FIG. 4 represents an interface element.

Internal to the interface member 18 (FIG. 4), a conductive column 111 is sunk into an isolating flexible substrate 112. Each column, such as column 111, is for example cylindrical. The substrate 112 contains an assembly of other mutually parallel columns each spaced lengthwise and extending widthwise along the interface member 18.

In use, this member is placed in contact with the conductor bearing surface 12 of a printed circuit board 11 such that a lower surface 113 of the column 111 is proximate a conductor 114 on the surface 12; surfaces of other columns similarly being proximate other conductors. The electrical potential in the conductor of column 111, may be monitored at its upper surface 115.

A conductive film 116 is applied to upper surface 117, excepting the regions of the upper surfaces of the conductive columns, which may be earthed to provide a sharp step in potential at the upper surfaces of the columns for examination of the electro-optical effect as herein before described.

It will be appreciated that since no current is required to pass along the conductive column 111, a high resistance can be tolerated in the region of proximity to the conductor 114. Thus, the apparatus may be used to examine a circuit mounted on a board, such as board 11, to which a film 118 of an insulating protective lacquer has been applied. This is a particularly important advantage of ATE in accordance with the present invention. It allows boards to be tested after all production steps, including lacquer application, have been completed. With prior art device testers lacquer cannot be applied as the nails have to make contact with the conductors directly; even with functional testing, lacquer must be penetrated if the manual probe is to be used. With the present invention, boards in finished condition may be tested.

Figure 5:
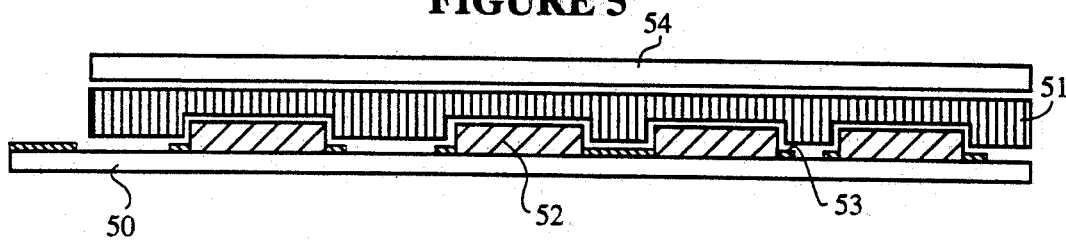
FIG. 5 represents an alternative interface element.

When the conductor bearing surface of the assembled circuit to be tested is uneven, as is the case for the board 5 represented in FIG. 5, the corresponding surface in the interface member is profiled, moulded or fretted to a suitable shape. The board 50 has for example a circuit using surface mounted components, (such as 52) the connection pins of which are directly affixed to the conductive tracks 53 without penetrating the board 50. In such an arrangement, a plane conductive surface may not be present, thus the interface member 51 is adapted to receive the surface mount components, to maintain a plane surface proximate the electro-optical medium 54.

Figure 9:
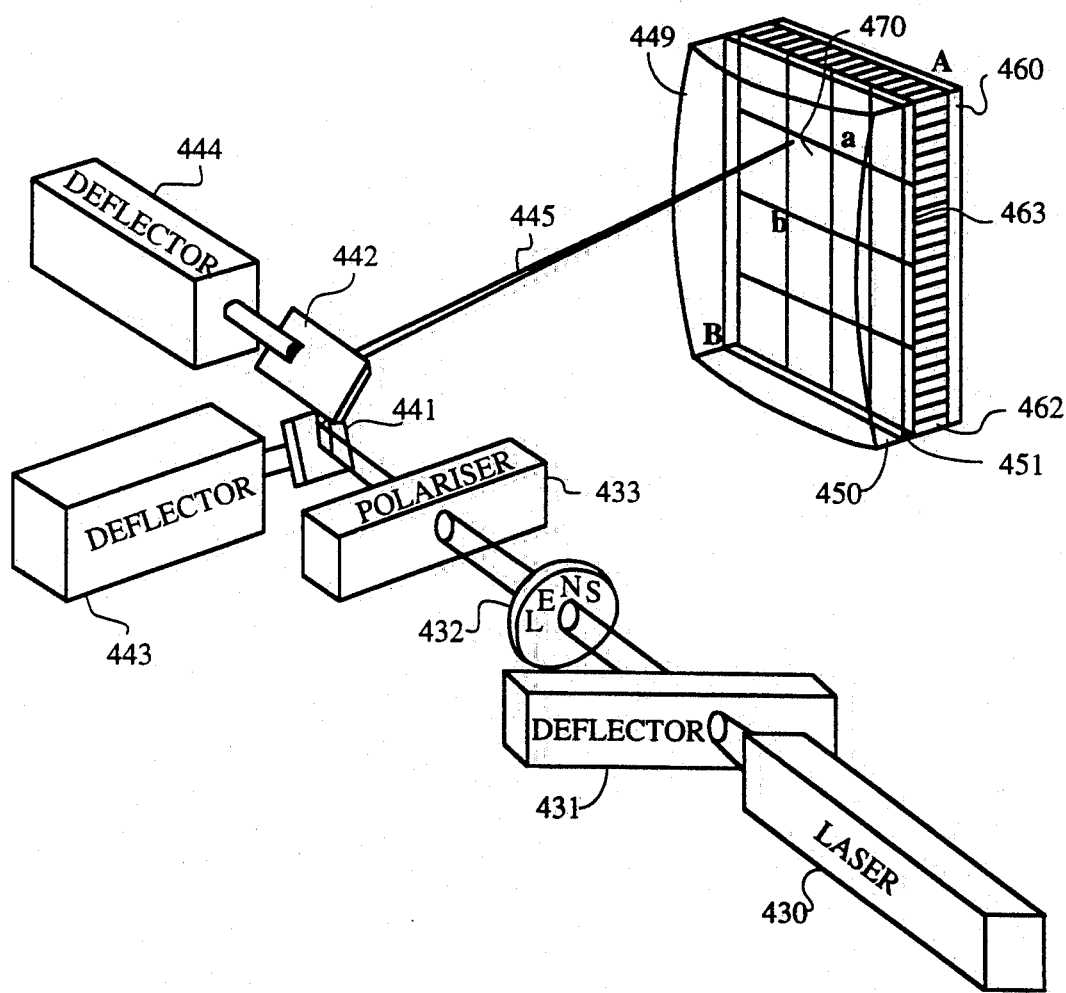
FIG. 9 represents schematically an embodiment of a deflection system used to optically examine the surface of the tested circuit board.

In an embodiment of a tester in accordance with the invention represented in FIG. 9, a mechanical deflection as well as an acousto-optical deflection is used to extend the scanned circuit surface. A laser 430 emits the test beam at an acousto-optical deflection apparatus 433 via a polariser 431 and a lens 432. The apparatus 433 comprises two acousto-optical deflectors for example of the types made by AUTOMATES ET AUTOMA- TISMES, 19, rue de Paris 78460 CHEVREUSE France.

The first deflector is mounted inside a housing 433 to deflect the laser beam in a first direction a and the second deflector deflects the beam so deviated in a perpendicular direction b, such that the two deflector combination allows the sweeping of a square surface of 50×50 millimeters at a distance of 1000 millimeters from the output of the lens 432 (corresponding to its focal length).

The beam emerging from the apparatus 433 falls on a pivoting mirror 441 of a first mechanical deflector 443 which reflects it onto a pivoting mirror 442 of a second mechanical deflector 444. The combination of the displacements of deflectors 443 and 444 in two directions A and B parallel to a and b allows the emergent beam 445 to sweep a rectangular surface of 500×500 millimeters in the focal plane of the lens. The beam 445 falls on the convex face 449 of a plano-convex lens of which the dimensions are 500×500 millimeters, made for example in BK7 glass.

A rectangular layer of a mosaic of BGO (Bismuth Germanium Oxide, $Bi_4 G_{33} O_{12}$) crystals is affixed to the plane face of the lens. The dimensions of the lens 450 and the electro-optical crystal layer 451 substantially correspond to the total area to be swept by the beam 445 exiting the system of deflectors 443, 444.

The BGO layer 451 has a thickness in the region of one (1) millimeter. In this example, the mating of the BGO layer 451 to the plane face of the lens 450 allows mechanical vibrations which occur naturally in the crystal as a result of piezo-electric resonance phenomena to be annulled. Such vibrations would be evident by virtue of the parasitic optical signals that they would cause by photo-elastic effects in the crystal.

The laser 430, polariser 431, acousto-optic and mechanical deflectors 433, 443, 444 and also lens 450 with the BGO layers 451, assembly is integrated with the optical recovery and detection system for the reflected light by the layer 451. This assembly, not illustrated in FIG. 9, is shown as 319 in FIG. 3 and comprises the splitter 303, the quarter wave plate 302 on lens 304, the WOLLASTON Prism 305, both photoelectric detectors 308 and 309 and the differential amplifier 310 forming an optical probe incorporated in the ATE head.

In use, an interface member 462 analogous to the interface member 18 (of FIG. 1) having anisotropic conductive properties is firstly placed against a face to be tested of a printed circuit board 460 (FIG. 9) to form an analogue of the card 460 conductor voltages in contact with one of its faces at its other face 463. This face 463 and the free face of the electro-optical crystal 451 at the heart of the optical probe are in contact for the test and firmly urged together by pressure means not represented allowing the elimination or minimising of all parasitic spacing between the contacting faces of the BGO layer 451, the interface member 462 and the board to be tested. In this example an elastomer sheet made by JSC TECHNIC in the Federal Republic of Germany and sold under the name 'ZEBRA bidimensionnel' has been used for the interface member; its thickness being between 0.1 and 5 millimeters for example in accordance with the board type and its surface discontinuities.

In FIG. 9, the checker region 470 corresponds to an elementary surface of acousto-optical scanning of the crystal of 50×50 mm. By virtue of a displacement by the mechanical deflection system, acousto-optical scanning of one hundred (100) such elementary surfaces next to each other over the surface of the electro-optical crystal 451 is possible.

Typically, the acousto-optical scanning rate which may be obtained is 100 KHz (the frequency of getting form one test point to another). The mechanical scan allows a change form one elementary region 470 to another in 50 milliseconds or so.

Consider a rectilinearly polarised light beam 445 at the input of the crystal layer 451 (FIG. 9). Its polarisation remains unchanged while crossing the layer if the conductor of the board to be tested in the region of the point of incidence of the beam has no voltage load. The application of a voltage creates a phase shift p(u) between the two components of the electric field of the light. The state of beam polarisation which passes back through the lens 450 at the output of the BGO layer 451 is then elliptical.

The emergent beam is redirected by the splitter 303 (FIG. 3) toward a detection lens 304, then is divided into two components by the Wollaston Prism 305. The intensities of these components are represented by $$I1 = \tfrac{1}{2} Io(1 + \cos(p + Po))$$

$$I2 = \tfrac{1}{2} Io(1 - \cos(p + Po))$$

in which Io is the incidence intensity and Po is the static phase lag introduced by the quarter wave plate 302.

The differential amplifier 310 gives a signal S $$S = I1 - I2 = Io(P + Po)$$

If the phase shift p is zero, the signal s is negligible in many cases due to the small amount of polarisation variation produced in the layer 451.

By way of example, for a BGO crystal of index 2 and of electro-optical coefficient equal to 1 pm/v, for a laser wavelength of 647 mm (Krypton laser) a value of $P = 8.10 - 4$ rad/v. is obtained.

In response, with a quarter wave plate, Po = pi/2 and $$S = Io \times P$$

the signal S varies linearly with V and values of P of the order of 10-4 radians may be straightforwardly detected. By virtue of the differential method adopted, this is true even if laser source intensity is subject to relatively slow fluctuations in time (up to about 10 percent).

The deformations caused by fixing the BGO crystals may give rise to parasitic birefingences which are different from one point to another. As a result Po varies from one point to another. Pl is biased to return to P½ after each positioning of the beam and before electrical measurements by inserting a Kerr cell 480 between the quarter wave plate 302 and the Wollaston Prism. This apparatus is constituted by a plate of electro-optical material placed between two transparent electrodes in a variable electric field supplied by a feedback loop 482 comprising a switch 484 and a variable amplifier 486 from the output 311 of the differential amplifier 310. The phase shift introduced by the plate 480 between the beam field components which pass through it then makes adjustment to the level required to cancel the background component of the signal S corresponding to the point tested. With test signals of a suitably high frequency, the high frequency component of the signal S contains the desired test information.

Figure 10:
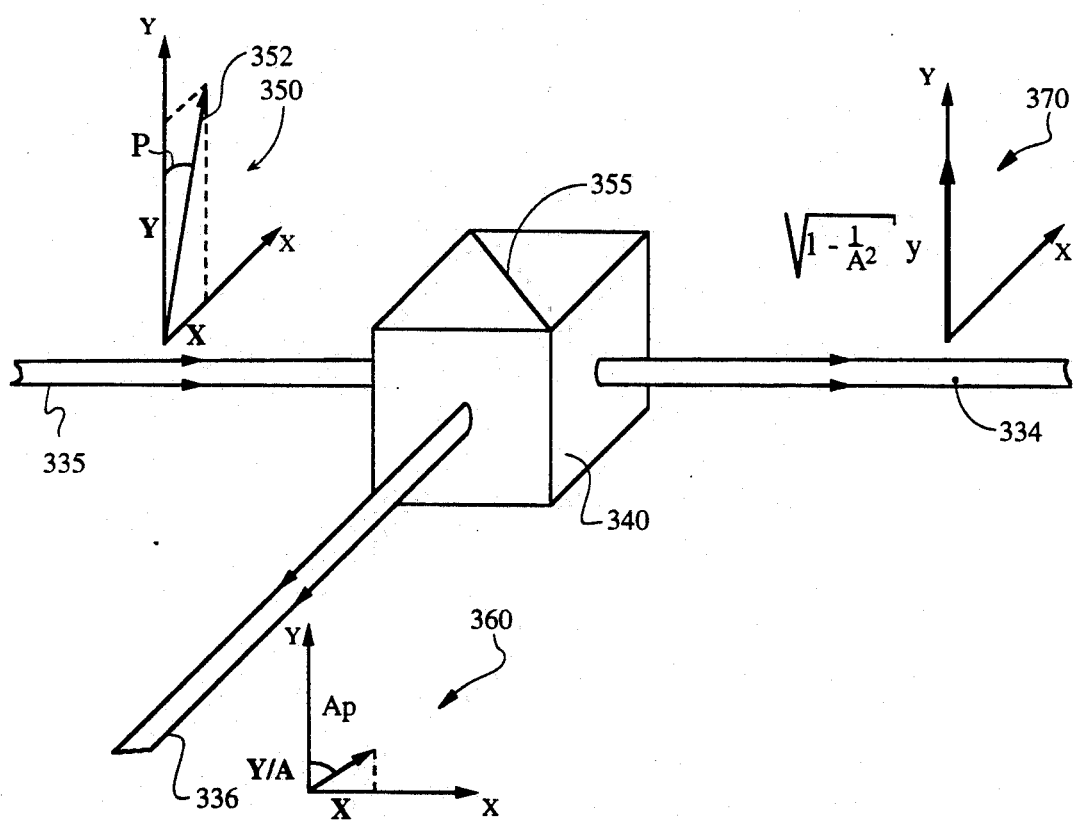
FIG. 10 represents an embodiment of an optical separator.

The modulation depth of the arrangement may be further improved by introducing an imperfect polariser 340 (FIG. 10) between the crystal layer output and the quarter wave plate 302. Polariser 340 is a cube intercepting the beam 335 leaving the lens 34 and used in place of splitter 303. Assume that a system of axes 350 represents the polarisation of light emerging from the lens, P being the angle of polarisation with respect to the initial direction of linear polarisation along the Y axis. The x and y components of sector 352, representing the polarised wave of the beam 335, represent the major axes of the elipse of polarisation, the Wollaston Prism 305 (FIG. 3) being orientated so as to split the light components along these two axes.

The splitter cube 340 separates the beam 335 into two beams, one transmitted 334, the other reflected 336. The interface 355 of the cube is arranged such that it behaves as a bad polariser for the reflected light and increases its ellipticity of polarisation. The component along the Y axis is greatly reduced as against the X component as is shown by the diagram 360 of FIG. 10 and in accordance with the principles discussed in French patent application having the number 88/04177 filed Mar. 30, 1988 in the name of the applicant. By contrast for the transmitted portion of the beam 334 this is linearly polarised along Y (diagram 370).

The components I1 and I2 received after separation of the beam 336 by the Wollaston Prism are expressed as follows:

$$I1 = (1 + Ap)Io/2A2$$

$$I2 = (1 + Ap)Io/2A2$$

A is a coefficient greater than 1 given by the characteristics of the polariser cube 340. These relationships show that a more powerful laser may be used to increase the modulated depth without saturating the detectors at the output of the Wollaston Prism.

Figure 11:
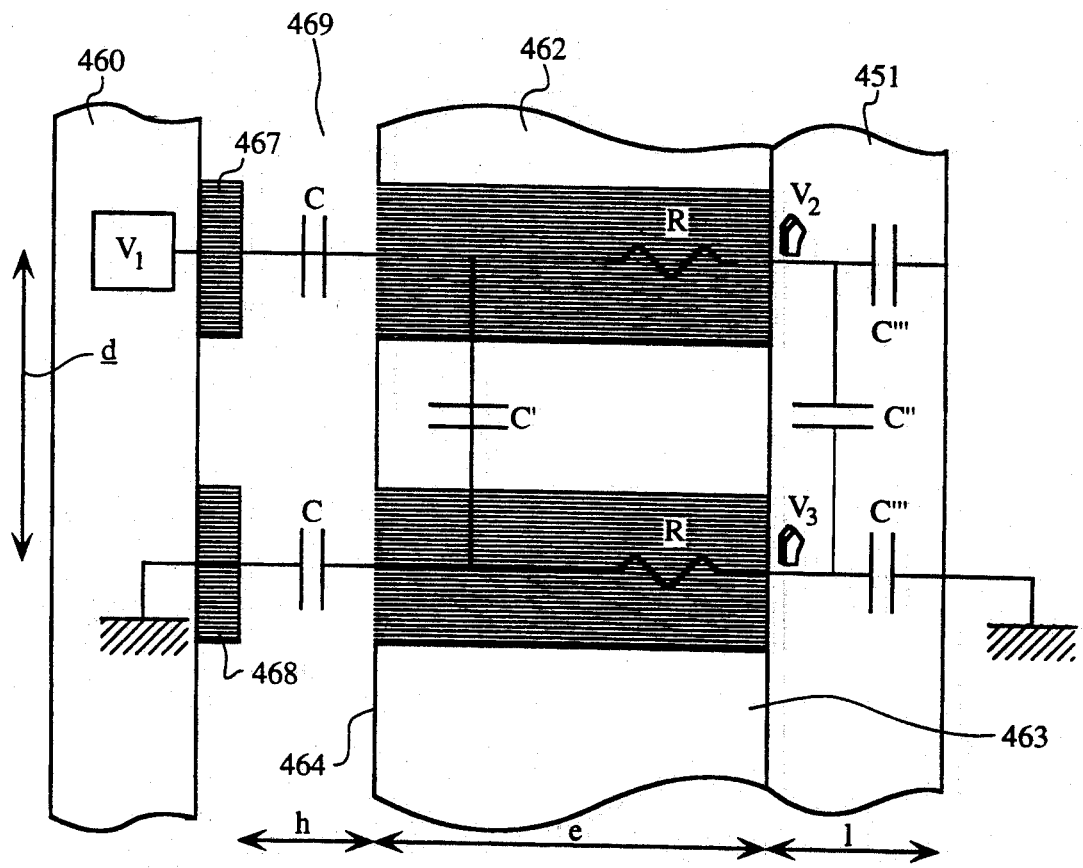
FIG. 11 shows placement of contact elements during a test.

The interfaces between the printed circuit board 460, the interface member 462 and the crystal layer 451 have been shown schematically in FIG. 11. Two conductors 467 and 468 forming two test points are indicated one under a voltage V1, the other at ground potential. The conductors are often covered in oxide. When the board is completed, they are covered with a lacquer. The layers of oxide or lacquer form a spacing 469 between the upper face of the board and the opposing face of the interface member 462.

An electrical equivalent circuit diagram of the arrangement is shown in FIG. 11. By virtue of the capacitances of the crystal, of the conductor and of the spacing 469, the voltage V2 which reaches the crystal in response to V1 is all the weaker as the capacitance of the spacing 469 is lower and that of the crystal is greater. Moreover, for a given interface member 462, the thickness of which is determined by the components mounted on the surface of the card 460, the more the interval 469 is made larger and the more the crosstalk, represented by the ratio V3/V2 is increased.

In one example, the parameters were as follows:
thickness of the interface member 462; e = 2 mm
thickness of the BGO crystal 451; = 1 mm
dielectric constant of the crystal; e' = 16
distance between the two test points; d = 400 micros
If the maximum allowable crosstalk is about 10%, the height h of the spacing 469 must not exceed 1.5 microns.

It is therefore desirable to deposit an electro-optical material having a dielectric constant as low as possible which at the same time presents an electro-optical coefficient as high as possible.

The relationship between the electro-optical sensitivity index of the crystal $n^3r$ (n being the refractive index of the medium and r its electro-optical coefficient) and the dielectric constant e' constitutes a yardstick (figure of merit) for the selection of material for use as the electro-optical layer 451. Table 1 below gives an indication of this relationship for different crystals.

TABLE 1

| Crystal | $n^3r/e'$ | Avail Dim (cm$^2$) | Origin |
| --- | --- | --- | --- |
| MNA | 50 | 1 | France |
| ZnTe | 10.8 | 1 | USA |
| AsGa | 3 | 100 | France |
| CuCl | 1.9 | 1 | France |
| Li Nb 03 | 1.6 | 10 | USA |
| Bi 12 Si 020 | 1.2 | 12 | Japan |
| Bi 4 Ge 3 012 | 0.5 | 100 | France |
| K Nb 03 | 0.5 | 2 | France |

With the apparatus with the BGO layer as envisaged above, reliable detection of test bits of 1 volt amplitude at a frequency of 5 MHz applied to test points 2 mm apart and separated by a ground conductor has been obtained. The thickness of the elastomer interface member was 2 mm, the contact surfaces without oxide and covered by a lacquer layer of 5 microns thickness.

Consideration of the preceding table shows that an organic composition such as MNA (2 methyl -4- nitroaniline) shows an increased figure of merit making this type of substance most interesting for the envisaged applications. Such a substance may be used not only in crystalline form, but also in a form combined with a support material in which the molecules of such an active electro-optical substance are incorporated. As a support material perspex (PMMA-poly methyl methacrylate) may thus be used with a density of MNA about 15%. The MNA is therefore then used as a dopant having molecules which are retained in the PMMA matrix, to make the composition electro-optical. Other possible dopants possessing electro-optical properties are for example the following:

DAN [4-(N,N-dimethylamino)-3-acetamidomitrobenzene]
COANP [2-cyclo-octylamino-5-nitropyridine]
PAN [4-N-pyrrolydino-3-acetaminomitrobenzene]
MBANP [2-(alpha-methylbenzylanino)-5-nitropyridine]

This type of polymer substance is the topic of many development programmes currently being undertaken by several enterprises, universities and research centres in the field such as the Lockheed Missiles and Space Company, Inc., Hoechst Celaneses Corporation and other large houses in the chemical field. (See for example the conference proceedings of the Symposium Entitled NATO Advanced Workshop: "Polymers for non linear optics", Sophia Antipolis Jun. 19–24 1988.) The polymers obtained may be used to form films, fibres or thin layers or thicknesses on a known substrate.

A particularly interesting characteristic of these polymers is the potential to use them in the form of films capable of being produced in large quantities and at reasonable cost. These films may be used in thicknesses of some microns (for example 10 microns) on transparent supports such as glass. They may also be delivered directly in the form of resilient films made up of several adjacent layers of elementary films (for example 500 microns thick). After drying, the molecules of the electro-optically active ingredient are captured in a support material in the amorphous state without particular orientation. To make the material electro-optic it is necessary to heat to a temperature sufficient to allow the active molecules to regain a certain mobility inside the matrix. The value of this transition temperature may vary with the polymer but may typically be around 100 to 120 C. In this state they may be subjected to orientation with respect to the support under the effect of an electric field. The molecules tend to orientate themselves in the direction of the exciting field. The stronger the exciting field, the higher the proportion of active molecules orientated in the direction of the field. When the temperature is again lowered whilst the molecules are oriented under the effect of the field, they keep this orientation. The material thus keeps an orientated structure which may be shown by an anisotropic optical behaviour (Pockels effect) in the presence of an electric field. Thus when the material is struck by linearly polarised incident light in the absence of an electric field the material does not give any change in polarisation. By contrast, in the presence of an electric field, the transmitted light sustains an elliptical polarisation linearly related to the intensity of the applied field.

Figure 12A:
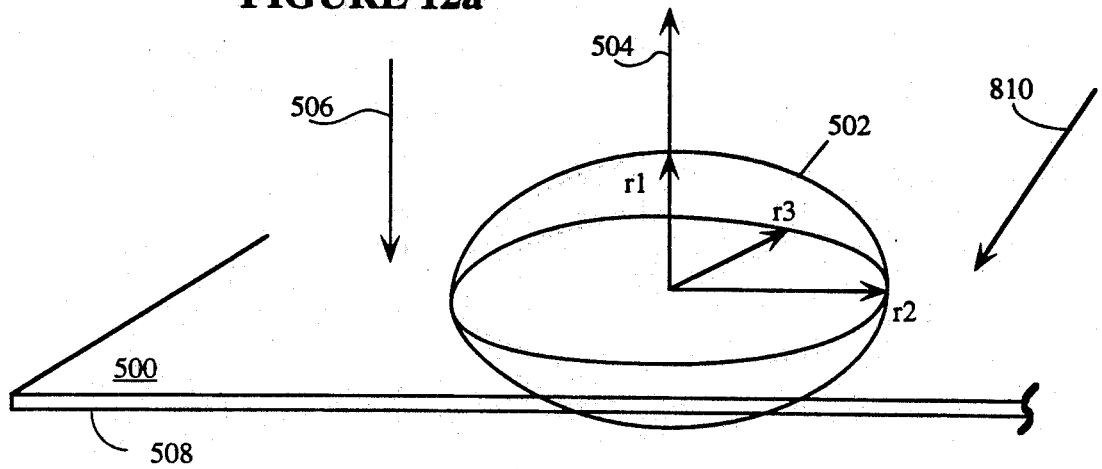
FIGS. 12a and 12b show the anisotropy index of an electro-optical film.

FIG. 12a shows the index distribution in an electro-optical film 500 realised in a polymer of the type previously described, the molecules of which have been orientated by the application of an electric field, called an aligning field, in a direction normal to its surface whilst the temperature was lowered below the transition region beyond which the electro-optical dopant molecules loose their mobility. An ellipsoid represented as 502 describes the refractive index distribution of the material whilst an electric field (called a detecting field) perpendicular to its plane is applied. This ellipsoid shows the spatial refractive index variations of the material. It has a symmetry of revolution with respect to the normal 504 in the plane of the film 500 which reflects the fact that the material is optically isotropic parallel to the plane of the film.

If the film 500 is illuminated with a polarised incident beam 506 normal to the film, the light recovered from the film (by transmission or following reflection from the opposite face 508 of the film) will not show a changed state of polarisation. This explains that when such a film is used for example in place of the BGO layer 451 of FIG. 9 voltages at the scanned circuit node cannot be detected. On the other hand an incident beam 510 angled with respect to the plane of the film will have its state of polarisation altered.

It is necessary therefore in this case to use a polarised incident light beam angled with respect to the electro-optical layer in order to reveal the Pockels effect created by the voltages in the tested circuit.

Figure 12B:
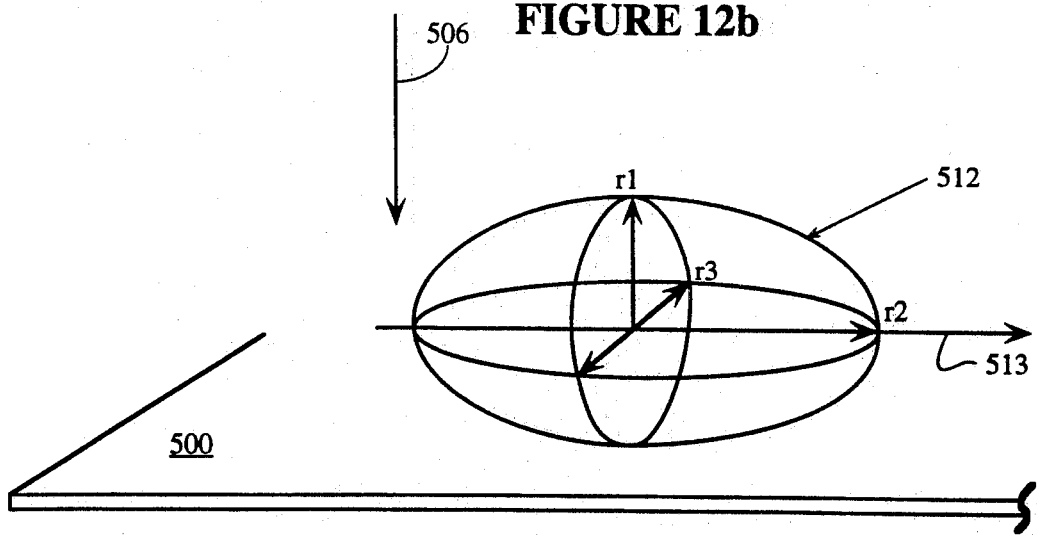

In FIG. 12b the ellipsoid of indices obtained with the same material under the action of a detecting electric field, normal to the plane of the film, is shown when the molecules of the film 500 have been previously orientated in the plane of the film by an aligning electric field. In this case the ellipsoid of the indices 512 has a symmetry of revolution with respect to an axis 513 in the plane of the film 500. A normal incident beam 506 then has its polarisation changed as a function of the difference in indices r2 and r3 along the principal axes of the ellipse in the plane of the film. Under these conditions the assembly of FIG. 9 (that is with normal incidence) with a polarimetric analysis apparatus such as represented in FIG. 3 allows the exploitation of the Pockels effect created by the circuit to be tested in the polymer film incorporated in the optical probe or the board.

Figure 17:
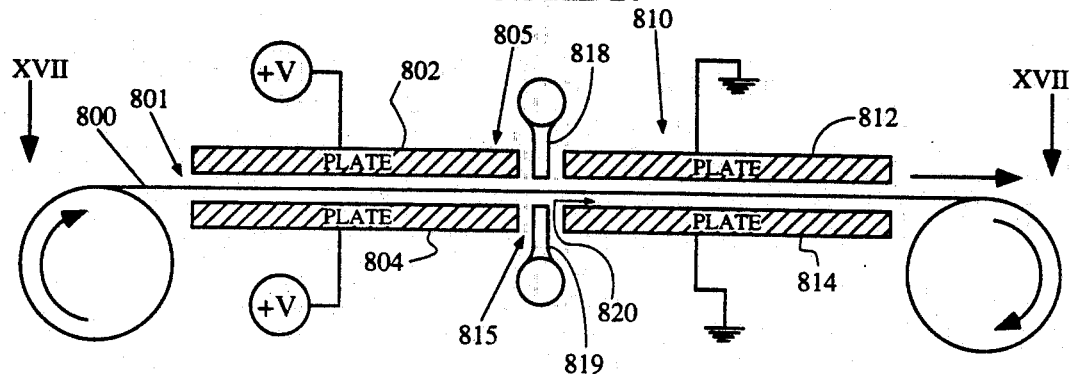
FIGS. 17 and 18 show schematically a method of preparing a polymer film useful for putting the invention into practice.
Figure 18:
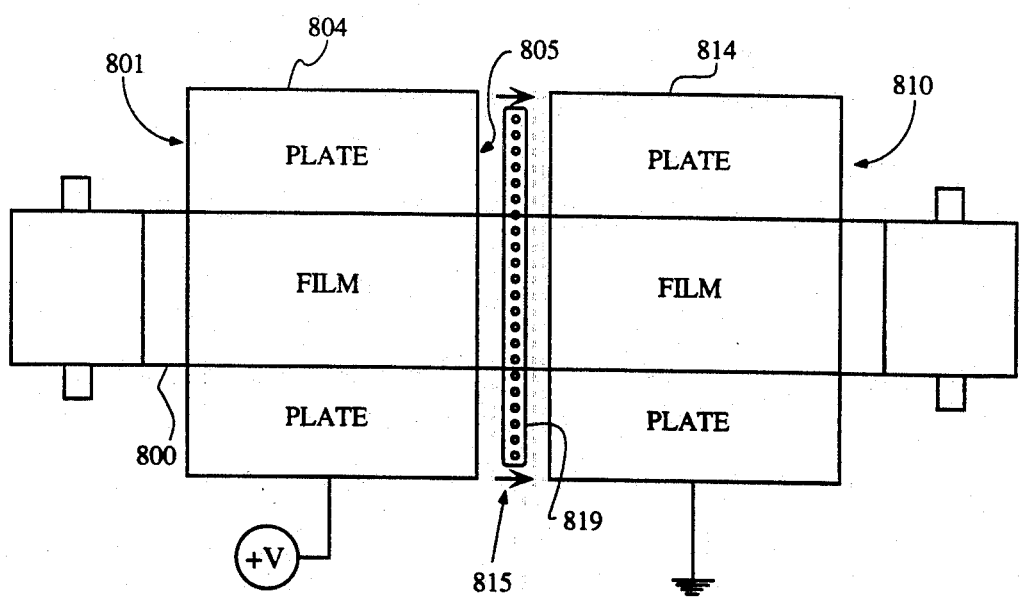

An apparatus for orientating the molecules of the active composition in the plane of the polymer film is illustrated in FIGS. 17 and 18 schematically. A strip of polymer 800 is placed in a tunnel oven 801 heated to a temperature T of about 100 C. (slightly higher than the transition temperature described above.)

The strip is guided in the interface between two opposing metal plates 802 and 804 which are maintained at a continuous identical electric potential +V. At the output 805 of the tunnel oven, the plate enters a second tunnel 810 defined by two opposing metal plates 812 and 814 which are maintained for example at zero potential. The result is that the spacing 815 between the heating tunnel exit 801 and the second tunnel 810 is subject to an electric field substantially uniform and parallel in the plane of the strip 800 which lays in this space 815. The electro-optically active molecules of the film tend to orientate themselves parallel to this direction under the local effect of the field at the exit 805 of the tunnel 801. Two nozzles 818 and 819 to either side of the film 800 open in the space 815 where they deliver a flow 820 of inert gas (for example argon or a sulphur hexafloride SF6) cooled to −40 C. to both faces of the film 800. The gas is exhausted from between the plates of the second tunnel by means not shown. The temperature of the film 800 traverses the transition region within the space 815. The active molecules maintain a preferred orientation in the plane of the film which cools in the second tunnel.

The preceding data concerning the orientation of the film structure and the incidence of the test light permits use of the electro-optical polymer film 500 for the testing of the signals in a circuit by the polarimetric method.

Alternatively, and in accordance with another aspect of the invention, a Fabry-Perot interferometric method may be adopted in place of polarimetry to detect the Pockels effect under the influence of the voltages to be tested.

Figure 19:
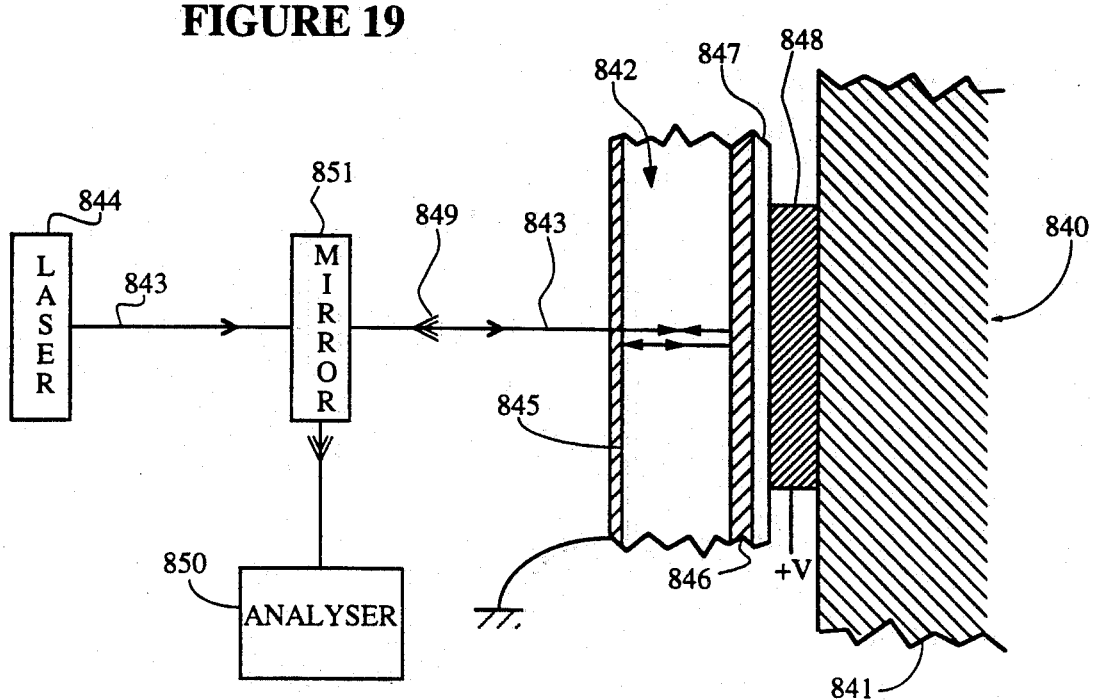
FIG. 19 represents an arrangement permitting the detection of the Pockels effect by an interferometic Fabry-Perot technique.

In FIG. 19 part of a circuit board 840, typical of an assembled circuit, is shown comprising a support 841 of isolating material on a face of which several electronic components are mounted; these are interconnected by conductive links such a 848.

A layer or plate of electo-optical material 842 is placed proximate the circuit supporting board 841 in contact with the upper surface of the conductor 848. It receives, given normal incidence, a laser beam emitted by a laser source 844. The surface of the film 842 facing the laser source is covered with a layer 845 of conductive and semi-transparant material which forms a semi-transparant mirror of average value coefficient of reflection. The other face of the film 842 (opposite the circuit board to be tested) is covered with a layer 846 of an electrically conductive and high coefficient of reflection material, for example a layer of aluminum thicker than the layer 845 so as to reflect a substantial part of the light which reaches it, the remainder being absorbed. A layer 847 is provided to absorb that part of the light transmitted by the reflecting face 846. The layer 846 may be formed of particles or fragments isolated one from another to avoid creating short circuits between neighboring conductive tracks on the board to be tested 840.

Interference is established between the light reflected by the parallel mirrors 845 and 847; the light beam emanating from the film (shown in the Figure with a double arrow) is defected by a semi-transparent mirror 851 and superimposed on the common path of the emitted beam 843 and the output beam 849 toward optical analysis means 850 for measuring the intensity of the light signal 849. As is known, the interference phenomenon is a function of the distance separating the mirrors, that is the thickness (e) of the film, the wavelength (lambda) and the refractive index (a) of the material of the film. The index "n" varies with the electric field to which the film is subject, itself a function of the potential V which it is desired to measure.

Therefore, measurement of the luminous intensity of the signal at the receiver 850 allows a measurement of the potential V at a given point on the circuit 800 to be obtained. It will be noted in particular that if the layer of electro-optical material 842 is a polymer film of the type described above (and which could be integrated with the board 840) the measurement of the Pockels effect is possible with perpendicular incidence with this interferometric technique, even when the electro-optical molecules of the film have been originally orientated perpendicular to its plane.

Figure 20:
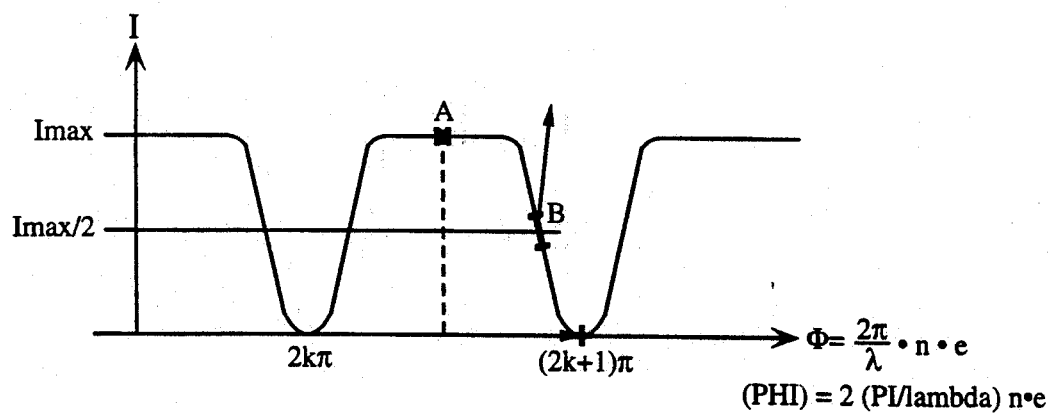
FIG. 20 shows an alternative to the technique of FIG. 19.

In order to alleviate the consequences of thickness differences in the electro-optical film or layer, the light source is adapted to emit a variable wavelength light beam. This means that the operating point of the apparatus may be shifted on its intensity characteristic curve (FIG. 20), of intensity as a function of PH1=[2 pi/lamba]n.e from a point A situated on a first part of the curve where I=Imax whatever PHI (therefore of zero sensitivity) to a point B situated on a second portion of the curve where I (being between Imax and 0) varies greatly as a function of PHI; the sensitivity is a function of the variation in I on the second portion of the curve about the point B; preferably point B corresponds to about Imax/2. When point B is fixed, the measurements are then affected by the wavelength corresponding to the point B.

Figure 13A:
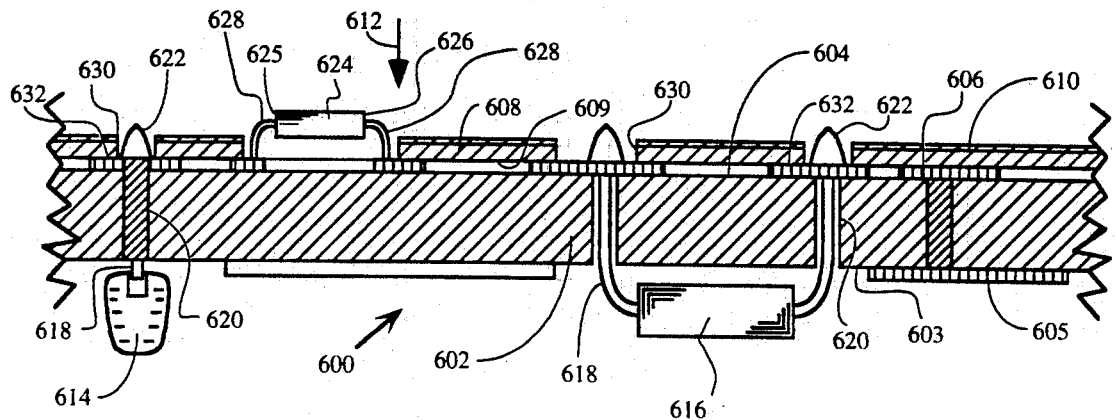
FIG. 13 represents a sectional view of a printed circuit board on which an electro-optical polymer has been incorporated for testing.
FIG. 13b shows in some detail an alternative to FIG. 13.
Figure 13B:
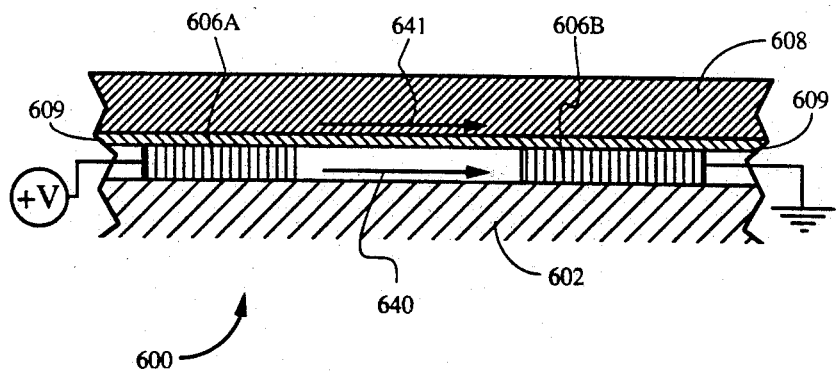

In FIG. 13, a printed circuit board 600 includes a substrate 602 of a material traditionally composed of epoxy and glass fibre which comprises on each of its faces 603 and 604 metallisations or conductive tracks such as 605 and 606, forming a network to which the components mounted on the board are connected.

The face 604 of the board is covered with a layer of polymer electro-optical film 608 which extends over substantially all the surface above the metallic tracks 606 which are formed there. The film 608 is incorporated on the card after the formation of the metallisations, but before the placement of components, for example by bonding. One side of the file 608, face 604, is covered with a checker-board pattern of elementary mirrors by means of a layer of reflecting aluminum 609. The size of the particles or pieces of the pattern is such that each piece cannot give rise to a short circuit between two neighbouring metallic tracks. On the opposing face, the film 608 is covered with another layer of aluminum 610 of a thickness sufficiently low to be transparent to test light projected at the board from direction 612. The layer 610 constitutes a reference electrode for the electric fields generated in the thickness of the film 608 by the voltages applied to the conductors 606.

The board 600 carries components such as discrete element 614 or integrated circuit package 616 on its surface 603. The components have connection pins 618 which penetrate the board substrate in holes 620 placed at right angles to the metallic tracks 606 on the other surface of the board, to which they are connected via solder pads 622. Also shown is a component 624 mounted on the surface 604 of the board, its two outer faces 625 and 626 being connected to two metallic tracks 606 respectively by two beads of solder 628. Before assembly of the components 614, 616 and 624 openings such as 630 have been formed in the polymer film 608 around the expected solder beads 622 and 628 to avoid any electrical contact between the metallic solder and the reference electrode 610. These openings may be formed by grinding before placement of the components on the card or be made in the film 608 before its joining to the surface 604 of the card. Alternatively, a film or film elements, preformed as a function of the board regions carrying the conductors to be tested may be placed upon the board before mounting. Contact regions such as 632 between the upper surface of the metallisations 606 and the film 608 provide the test points.

The test points are monitored by projecting an incident laser beam and analysing the beam reflected by the corresponding metallic mirror 609. This analysis is made with a test probe analogous to the apparatus of FIG. 9, except that the BGO layer 451 and the interface layer 462 are omitted. In fact, the light leaving the plano-convex lens 450 strikes the card mounted adjacent its plane face directly. The beam returned by each point of the tested board 600, changed by the effect of the voltage driving this point, is detected and analysed by an arrangement such as that 319 of FIG. 3. The closeness of contact between film 608 and the tested conductor 606 ensures excellent optical conservation of the signals to be monitored and good spatial resolution. In certain board arrangements, (FIG. 13b) wherein the conductive regions 606A to be examined are by construction placed proximate a ground connected region 606B, an electric field parallel to the plane of the electro-optical film is established (field lines 640, 641 FIG. 13b). The existence of this field may be directly tested without any opposite polarity electrode that might otherwise be necessary. The Pockels effect then appears by virtue of a substantially parallel field in the plane of the film, rather than a perpendicular field.

In accordance with another embodiment of the invention, use of a electro-optical polymer film directly in a tester optical probe is envisaged. In fact, the good characteristics of these materials, what with the high level of their electro-optical coefficient and their low dielectric constant, make them well adapted to this application. They may be made in the form of a layer bonded, for example, on the plane face of the plano-convex lens 450 (FIG. 9) in place of the BGO crystal layer 451.

In accordance with another advantageous technique, the use for each type of board of an electro-optical transducer specific to that type of board is envisaged. In this connection the fact that the costs associated with polymers of the type indicated are not very great is put to good effect. It is therefore possible to make for each new type of board to be tested a transducer designed to be associated with the optical probe during the test but which is adapted to that form of board.

Figure 14:
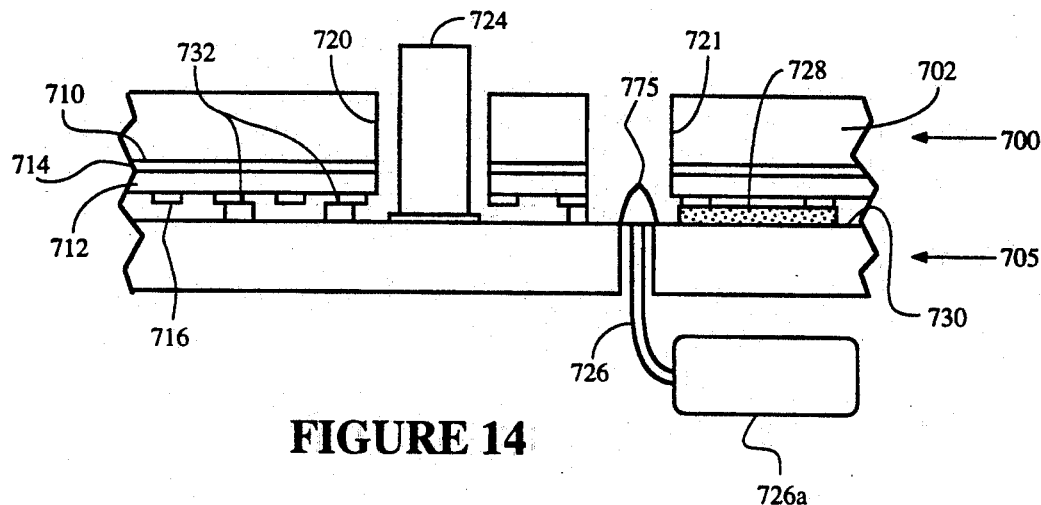
FIG. 14 shows an embodiment in which a preformed electro-optical film is placed upon a board.
Figure 15:
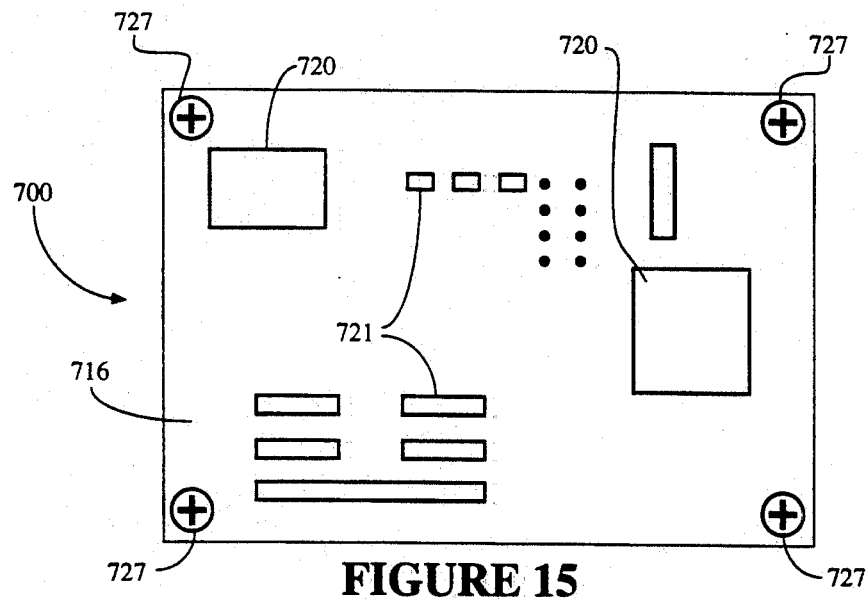
FIG. 15 shows a plan view of the film used in FIG. 14.

The transducer 700 (FIGS. 14 and 15) is in the form of a plate 702 of glass or a transparent plastic material of low photo-elasticity and straightforwardly workable so as to be able to create interior openings or cavities in which the components, the solder pads and other discontinuities in the upper surface of a printed circuit card 705 are located when the transducer 700 is coupled for the test.

An electro-optical polymer film of the type already described with reference to FIG. 12 is deposited onto the face 710 of the transducer 700. Film 712 is covered by an aluminum transparent electrode 714 where it mates with the support plate 702. The lower face of the film 712 is covered with a reflective layer 716, also in aluminium. As previously, this layer is not continuous, but formed of particles mutually spaced apart such that a particle in contact with a conductor on the surface of the board cannot also contact or have its potential influenced by a neighbouring conductor.

The openings 720, 721, for example are arranged in the transducer 700 to allow components such as 724 to enter or beads of solder such as 725, by which the pins 726 of components 726 a passing through the board 705 are fixed to conductors 728 to the surface 730 of the board against which the transducer 700 is placed, to be accommodated.

The plate 702 gives rigidity to the transducer sufficient to allow the electro-optical polymer film 712 to be placed against the conductors such as 728 and 732 at the surface 730 of the board 705 when the board 705 and the transducer 700 are brought together, by manipulation apparatus (not shown). The parasitic capacitances between the sensitive film 712 and the contacts are at a minimum level, which allows good spatial resolution to be obtained, for example 0.1 mm, with a lacquer of 10 microns thickness. The result is substantially better that the resolution possible with a relatively thick interface elastomer such as described with reference to FIGS. 1 to 3. The reduced thickness of this lacquer allows crosstalk between very close test points to be kept to low levels.

The support plate may be made by commonplace mechanical means. The sensitive film (FIG. 15) may itself be made by laser. The transducer assembly 700 may be fixed in contact directly with (or immediately adjacent to) to the planar face of the field lens (cf. 450, FIG. 9) of the optical probe in place of the arrangement formed by the BGO lacquer 451 and the elastomer interface 462. Alternatively it may be manipulated separately form this lens at the time of inserting the board to be tested. As in the case of an electro-optical board of FIG. 13, the film portions or electro-optically sensitive films may be separate and reduced to a predetermined number of test points or regions distributed over the board surface. Regions without mirrors or openings are provided in the transducer 700 to allow the positioning of reference marks 727 from which the beam deflection system is calibrated to precisely direct the incident beam toward the conductors for nodes to be tested in the circuit. The deflection assembly 433, 443, 444 (FIG. 9) control system may then be programmed to selectively interrogate the nodes of the board corresponding to the regions of the transducer which are provided with electro-optical film or material.

Figure 16:
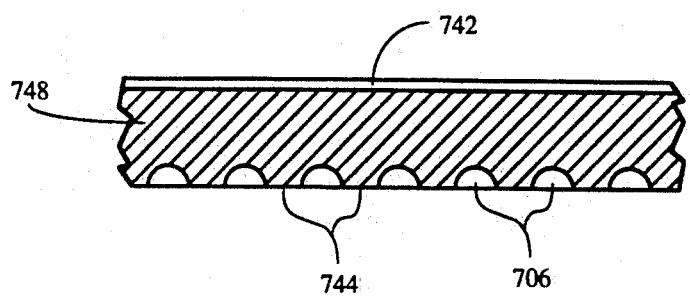
FIG. 16 shows an alternative embodiment of the film used in FIG. 14.

FIG. 16 shows schematically a sectional view of an electro-optical film 740 provided on a transparent reference electrode 742 on one of its faces. Its other face is covered by a checker pattern of small mirrors 744 formed by a thick deposition of aluminium. To further increase the contrast of measurement, the polymer is etched (chemically for example) between the mirrors to create dips 706 of depth of the order of the required resolution (0.1 mm for example). Thus the capacitance between two neighbouring mirrors 744 is reduced. This film may be used in the transducer 700 of FIGS. 14 and 15.

Over and above the fact, already outlined, that the invention allows completed boards to be tested, that is boards covered with lacquer, another advantage of the invention is that the activity of internal nodes may be observed with a disruption all but negligible with respect to prior art testers. In fact, all contact with a probe, that is an element in which current flows, disrupts the normal operation of the monitored circuit, such that it may, with prior art testers, not be operating in the same way when it is tested and when it is not.

In conventional testers, the maximum speed at which a monitored circuit may function may, in some cases, be limited by the requirements of the test. Thus, tests are not conducted in the same operational environment as that in which the circuit ought normally to function. This constitutes a major problem with prior art testers, the manual diagnostic probe of which has a high capacitance (of the order of 100 pf). On the other hand, the interface member 18 may only have a capacitance of 1 pf, thus allowing circuit operation at full speed during test.

Figure 6:
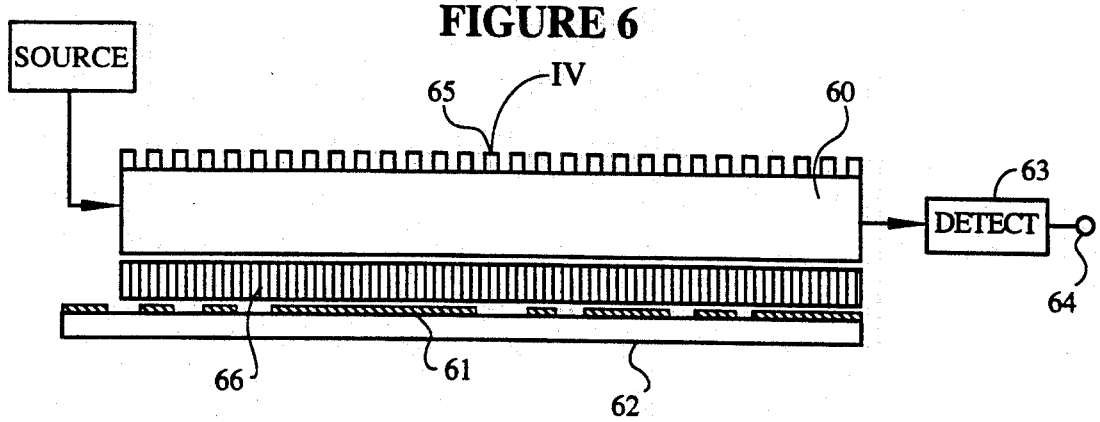
FIG. 6 represents alternative ATE in accordance with the invention.

The electro-optical material mentioned above produces a substantially linear electro-optical effect at the wavelengths envisaged (Pockels effect), that is variation of angle of polarisation of a beam crossing these materials under the effect of an electric field in the region of crossing in proportion to this field. Other materials present a quadratic effect (Kerr effect) in accordance with which the variation in the angle of polarisation is proportional to the square of the electric field. This property is put to use in an alternative embodiment of the invention (FIG. 6), wherein the light is directed generally and laterally at a quadratic electro-optic medium 60 placed electrically proximate conductors, such as conductor 61, printed on a board 62 of an electric circuit to be tested.

Light is received at an opposite edge face of medium 60 by a detector 63 which produces an output 64 in accordance with the principles already outlined. Output 64 may be used by ATE as herein before described.

Electrodes, such as electrode 65, are deposited upon the upper surface of the electro-optical medium 60 along the path of the light. Electrical connections (not shown) allow each electrode to be biased to a chosen potential, for example to zero or to a potential of twenty volts with respect to a reference potential.

Under these conditions, the nature of the transmitted light received at detector 63 will be dependent upon electrical potentials appearing across the electro-optical medium. As the circuit below the medium is exercised these electrical potentials will be relayed to the underside of the medium 60 via a relaying member 66. Taking as an example a digital circuit, having logic 0 at 0 volts and logic 1 to 5 volts and assuming that all biasing electrodes 65 are biassed to the 0 volts, either a zero or a 5 volt potential will be applied across the electro-optical medium 60.

Figure 7:
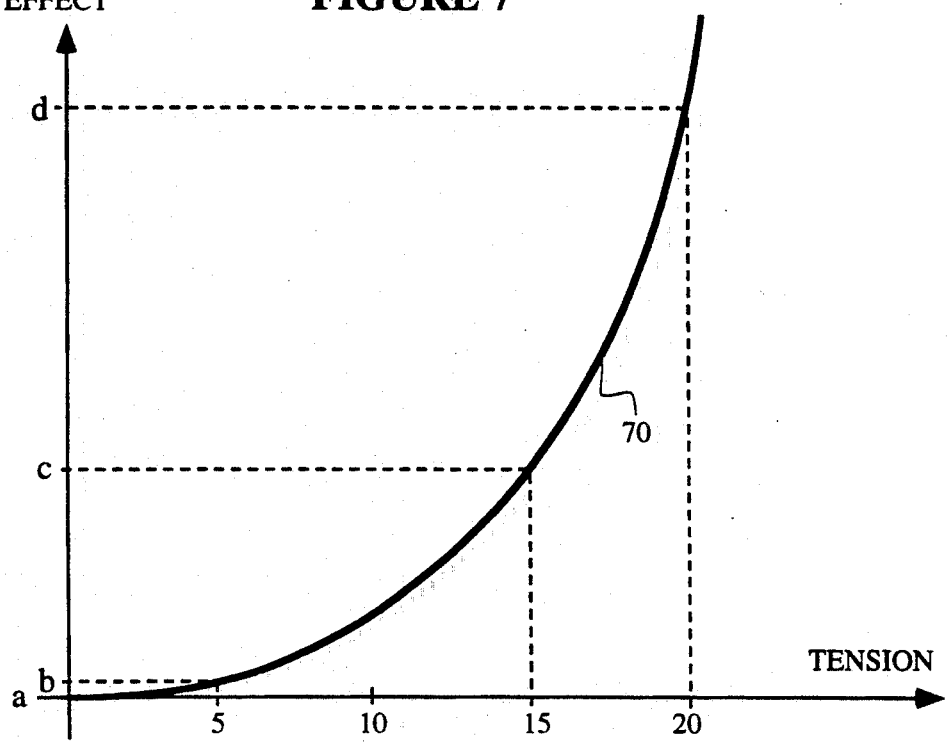
FIG. 7 represents a characteristic of the electro-optical effect with respect to applied electrical voltage.

The characteristic (FIG. 7) of the electro-optical medium chosen for this embodiment of the invention, for example a PLZT ceramic composition of the type used for the control of optical gates on laser beams, is a curve 50, defining effect against voltage. Thus for 0 to 5 volts applied potential, the electro-optical effect will be detected between a and b along the ordinate. Assume now that one electrode, say electrode 65, is biassed to a potential of 20 v. The effective potential appearing across the medium 60 in the region of the conductor 61 is thus either 20 volts (logic 0) or 15 volts (logic 1). These potentials will produce an effect between c and d.

It will be appreciated that dynamic signals appearing in the region of a biassed electrode may therefore be discriminated from cumulative effects produced in the unbiassed region, the swing c-d being much greater than the swing a-b. Hence by selectively biassing the electrodes, activity in any region along the tract of the light may be examined.

Figure 8:
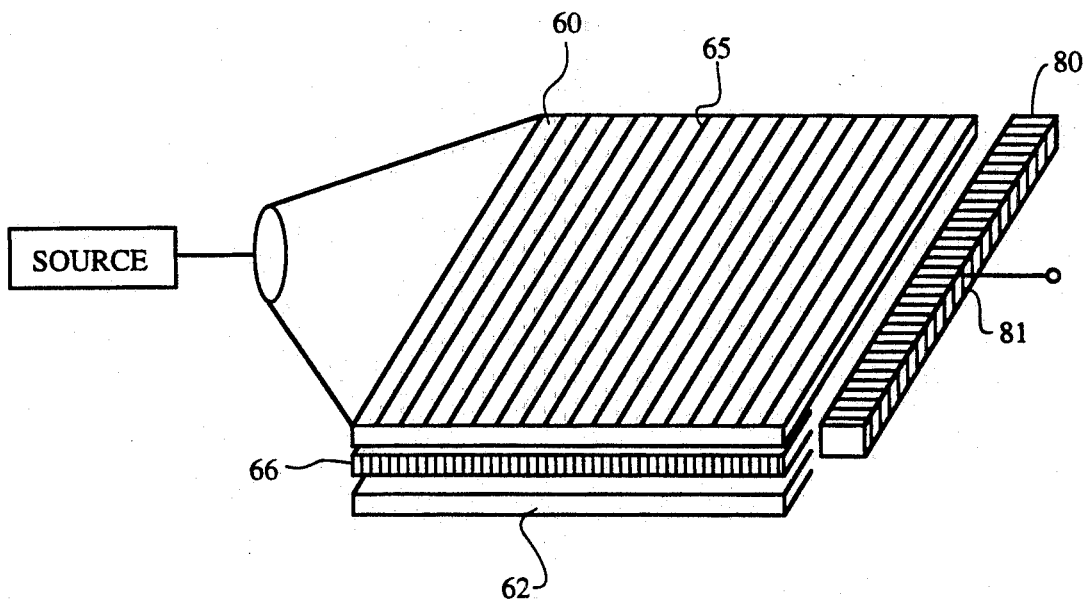
FIG. 8 is a perspective view representing the elements of the ATE of FIG. 6.

For examining any region of activity, an array of detectors 80 (FIG. 8) extending edgewise is required. Where parts of the embodiment of FIG. 6 correspond to those of FIG. 8, common reference numerals have been used. Biassing electrodes, such as electrode 65 extend laterally stripwise across the medium 60 in a direction substantially perpendicular to the mean direction of light propagation in the medium, such that electrical activity in any region may be examined by energising the electrode which biasses that region and by selecting the detector output signal, such as 81, which receives the light which crosses that region.

The way in which ATE in accordance with the present invention may be arranged to operate will now be considered.

In an assembled circuit, such as a printed circuit board, the state of each of the outputs clearly depends upon the previous states of the inputs. For example, the state SK of the Kth output, for a known to be good circuit, is a function FK of the array [E] of the input states, this may be written:

$$SK = FK([E]0).$$

The purpose of prior art functional testers is to verify that for an array [E] of input states assigned to the circuit, the state of each output, such as state SK of the Kth, is well founded on the array [E] of input states through application of a function, such as FK, which characterizes correct operation of the circuit. If that is not the case, that is if the state of at least one output, such as the kth, is not correct and, for example, S'K takes the place of SK, the monitored circuit is clearly faulty.

This information, however, provides no help for the repair of the circuit, it will also be appreciated that the dependance of SK and [E] is very complex.

Upon further investigation, it will be seen that the state of each of the outputs depends upon the state of the inputs via the intermediary of the states adopted by the internal circuit nodes. For a good circuit, it may be shown that the state SK of the kth output depends, by virtue of a function denoted as GK, on the array [E] of the input states, not only directly, but through the intermediary of the state I1 of a first internal node, the state I2 of a second internal node, etc. . . . . . This may be expressed, for the case of a circuit with n internal nodes, as:

$$SK = GK (I1, I2, \ldots, In)$$

If, instead of adopting the state SK, the Kth output adopts the state S'K, which maybe because instead of adopting the state I1, the first node adopts a state I'1, and/or because instead of adopting the state I3 the third node adopts a state I'3, etc. . . . , this gives rise to a series of possibilities, such as:

$$S'K = GK (I'1, I2, \ldots, In) \text{ or}$$

$$S'K = GK (I1, I2, I'3, \ldots In) \text{ or}$$

$$S'K = GK (I'1, I2, I'3, \ldots In), \text{ etc.} \ldots$$

In general, the appearance of an abnormal state S'K may be a priori due to a large number of possible causes, amongst which a prior art functional tester cannot detect the actual cause without recourse to long and difficult additional functions.

By contrast, ATE in accordance with the present invention may, during diagnosis, that is after a functional problem with the tested circuit has been established, shown by at least one abnormal result in the examination of the circuit output nodes, be used as follows. First of all an internal node is selected and examined, and all possible or desirable state combinations are applied to the circuit input nodes whilst the corresponding node states are examined and recorded. From the results data obtained, as great a number as possible of possible fault hypotheses are eliminated. Then another node is chosen and the same procedure repeated. The internal nodes are thus examined one by one until evidence of the cause of the fault is revealed.

Those skilled in the art will understand that the present invention is not limited to the embodiments described and put forward above. Hence, the present invention is not limited to the technique of backtracking which involves the use of expert systems. Those skilled in the art will also understand that although the embodiments described make use of but one light beam, use of several beams is with the scope of the present invention.

Figure 21:
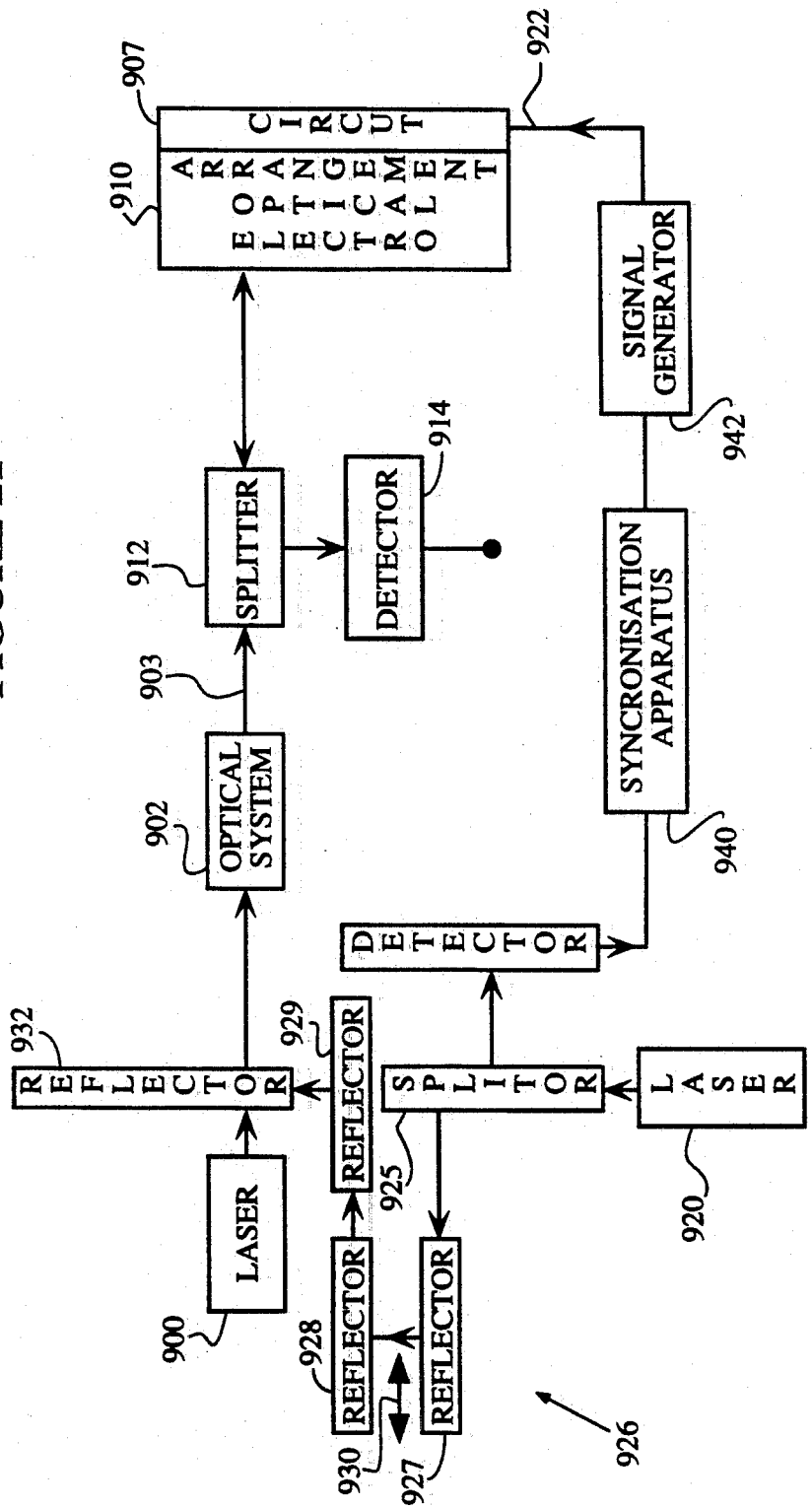
FIG. 21 represents an arrangement permitting a detailed analysis of wave forms of the signals at circuit nodes.

Moreover, the arrangement which has just been described for circuit testing may be combined with a spectrum analyser of the signals provided by such a circuit. In the system described thus far the signals are recorded in real time and the test takes account only of the presence or absence of pulses at predetermined instants. The pass band of the system, limited by that of the detectors used, may be in the region of 100 MHz for example. A detailed analysis of waveforms at a much greater frequency may however be obtained by operating as described herein after with reference to FIG. 21, in accordance with a sampling (stroboscope) technique.

A CW laser of the type already described 901 is arranged to project the test light toward an optical system 902. This system is of the type previously described. It produces and sweeps an analysis light beam 903 projected in the direction of a circuit 907 to be tested across an electro-optical arrangement 910 comprising for example a field lens and an electro-optical transducer of the type described with reference to FIG. 9. The reflected optical signals are divided by a splitter and transmitted to a detector 914.

A second laser 920 of the pulsed type is provided which emits at a predetermined repetition rate pulses which are very short with respect to the duration of signals produced at the circuit nodes in response to test excitations applied to the inputs 922 of the circuit 907. The light pulses of laser 920 are directed on the one hand to a photodetector 924 and on the other, via a splitter 925, across a variable optical delay line 926, toward a reflector 932 which directs the pulses toward the input of the optical system 902 along the same axis as the light output of the laser 900. The delay line 926 comprises two movable reflectors 927 and 928 allowing two right angle bends in the direction of the beam output of the splitter 925, and a fixed reflector 929 to realign the beam in the direction of reflector 932. The optical delay imposed on the beam between the pulsed laser 920 and the optical system 902 may be modulated by bringing together or moving apart the two reflectors 927 and 928 and the fixed mirror 929 (arrow 930).

The electrical output of the photo detector 924 is connected to synchronisation apparatus 940 which controls the test signal generator 942 connected to the inputs 922 of the circuit board 907 such that the electric pulses are applied to the inputs with a repetition rate equal to that of the pulsed laser.

The duration of the pulses of laser 920 is very short compared with the pulses at the inputs 22. The signal provided by the detection system 914, of low bandwidth compared with the length of the laser pulses, is integrated over a large number of samples. Each point of a waveform or a circuit node may be examined by a suitable adjustment of the optical path between the pulsed laser 920 and the optical system 902. Alternatively, an electrical adjustment of the synchronisation pulses may be made.

In use in testing the continuous laser 900 emits; the pulsed laser is off. For a detailed timing analysis, the laser 900 is switched off and the pulsed laser 920 excited.

We claim:

1. A method for testing a circuit having conductive circuit elements disposed proximate a surface thereof, comprising the steps of:
   conformably disposing a sensor having a layer of electro-optical material with first and second opposing surfaces on said circuit surface so that voltages on the conductive circuit elements are imposed on the first surface of said electro-optical material;
   applying test signals to the circuit;
   establishing an electric field that traverses said layer of electro-optical material by applying a potential to an electrode disposed on the second surface of said electro-optical material, an optical property of said electro-optical material being varied in substantial synchronism with voltages on said conductive circuit elements;
   measuring said optical property in regions of said electro-optical material; and
   determining a test parameter from the results of said measuring step.

2. A method as in claim 1, wherein said electro-optical material comprises a resilient electro-optical polymer film and wherein said sensor disposing step comprises the step of urging said polymer film against said circuit surface.

3. A method as in claim 2, wherein said sensor disposing step further comprises the step of patterning said polymer film to accommodate the contour of said circuit surface.

4. A method as in claim 1, wherein said electro-optical material comprises a resilient electro-optical polymer film and said sensor disposing step comprises the step of applying said polymer film on said circuit surface during manufacture of said circuit.

5. A method as in claim 4, wherein said sensor disposing step further comprises the step of patterning said electro-optical material to accommodate the contour of said circuit surface.

6. A method as in claim 1, wherein:
   said circuit includes conductors corresponding to external circuit nodes, and said conductive circuit elements include conductors corresponding to internal circuit nodes;
   said electro-optical material is coated with a reflective material on a surface nearest said circuit surface;
   said applying step comprising the step of applying a pattern of electrical test signals to said external circuit node conductors; and
   said measuring step comprising the steps of:
      directing polarized light toward selected regions of said electro-optical material through a surface thereof opposing said coated surface, said selected regions being electrically proximate said internal circuit node conductors;
      receiving light reflecting from said selected regions; and
      comparing the polarization of said directed light and said reflected light for each of said selected regions.

7. A method as in claim 1, wherein:
   said circuit includes conductors corresponding to external circuit nodes, and said conductive circuit elements include conductors corresponding to internal circuit nodes;
   said electro-optical material is coated with a reflective material on two opposing surfaces, the surface nearest said circuit surface being highly reflective and the other surface being semi-transparent;
   said applying step comprising the step of applying a pattern of electrical test signals to said external circuit node conductors; and
   said measuring step comprising the steps of:
      directing light toward selected regions of said electro-optical material through said semi-transparent surface, said selected regions being electrically proximate said internal circuit node conductors;
      receiving light emanating from said selected regions, said light being influenced by interference in said electro-optical material; and
      measuring the luminous intensity of said emanating light for each of said selected regions.

8. A method as in claim 7 wherein said measuring step further comprises the step of shifting the wavelength of said directed light to alleviate the consequences of a thickness variation in said electro-optical material.

9. A method as in claim 1 wherein said measuring step comprises the steps of:
   providing polarized first light to a region of said electro-optical material corresponding to a circuit test point;
   increasing the ellipticity of polarisation of the light resulting from the incidence of said first light on said electro-optical material; and
   analyzing the light from said ellipticity increasing step.

10. A method as in claim 1 wherein said measuring step comprises the steps of:
   providing polarized first light to a region of said electro-optical material corresponding to a circuit test point;

introducing a phase shift in the light resulting from the incidence of said first light on said electro-optical material; and analyzing the light from said phase shift introducing step.

11. A method as in claim 1, wherein said electro-optical material is a polymer having electro-optically active molecules, and wherein said disposing step comprises the step of conformably disposing said electro-optical sensor on said circuit surface such that the electro-optically active molecules of said polymer within said sensor are oriented in a direction other than normal to said circuit surface in the absence of an electric field.

12. A method as in claim 11, wherein said polymer includes a reflective first face nearest said circuit surface and an opposing second face, and wherein said measuring step comprises the steps of:
 directing polarized light toward selected regions of said electro-optical material through said second face, in a direction substantially normal to said circuit surface;
 receiving light reflected from said selected regions; and
 comparing the polarization of said directed light and said reflected light for each of said selected regions.

13. A method as in claim 1 wherein said sensor further comprises a flexible coupling medium having a plurality of conductive channels therein terminating on first and second opposing surfaces thereof, said sensor disposing step comprising the steps of:
 applying the first surface of said coupling medium to the first surface of said electro-optical material;
 applying the second surface of said coupling medium to the surface of said circuit; and
 pressing said sensor against said circuit so as to deform said coupling medium to conform with the surface of the circuit.

14. A method for testing a circuit having conductive circuit elements disposed proximate a surface thereof, comprising the steps of:
 conformably disposing an electro-optical sensor on the circuit surface by disposing a flexible coupling medium having isolated conductive channels therein opening on opposing surfaces, between electro-optical material within said sensor and said circuit surface; and urging said electro-optical material toward said circuit surface for conforming the opposing surfaces of said coupling medium with juxtaposed surfaces of said electro-optical material and said circuit surface respectively;
 establishing an electric field between said conductive circuit elements and an interior of said sensor, through said electro-optical material in a direction substantially normal to the circuit surface;
 applying test signals to the circuit;
 measuring at selected regions within said electro-optical material an optical property of said electro-optical material influenced by said electric field, said optical property being varied in substantial synchronism with signals on said conductive circuit elements; and
 determining a test parameter from the results of said measuring step.

15. A method as in claim 14, wherein said sensor disposing step further comprises the step of contouring the unaffixed opposing surface of said coupling medium to match the contour of said circuit surface.

16. A method for testing a circuit having conductive circuit elements disposed proximate a surface thereof, comprising the steps of:
 conformably disposing an electro-optical sensor on said circuit surface;
 establishing an electric field between said conductive circuit elements and an interior of said sensor, through electro-optical material within said sensor in a direction substantially normal to said circuit surface;
 applying test signals to said circuit;
 measuring at selected regions within said electro-optical material an optical property of said electro-optical material influenced by said electric field, said optical property being varied in substantial synchronism with signals on said conductive circuit elements; and
 determining a test parameter from the results of said measuring step;
wherein:
 said circuit includes conductors corresponding to external circuit nodes, and said conductive circuit elements include conductors corresponding to internal circuit nodes;
 said electro-optical material is provided with discrete electrodes on a surface opposite another surface nearest said circuit surface;
 said applying step comprising the step of applying a pattern of electrical test signals to said external circuit node conductors; and
 said measuring step comprises the steps of:
  directing polarized light through a portion of one end of said electro-optical material in a direction generally parallel to the opposing surfaces thereof;
  biassing a selected one of said electrodes; and
  receiving light from said end portion at a portion of an opposing end of said electro-optical material in a detector, the output thereof being indicative of an optical property at a selected region of said electro-optical material electrically proximate a nearest one of said internal circuit node conductors.

17. An apparatus for testing a circuit having conductive circuit elements disposed proximate a surface thereof, comprising:
 sensor means having a conformable property and comprising a layer of electro-optical material having parallel first and second opposing surfaces, said sensor means further comprising an electrode disposed on the second surface of said electro-optical material and being disposed on said circuit surface in a conformal manner so that voltages on the conductive circuit elements are imposed on the first surface of said electro-optical material;
 means for applying test signals to said circuit;
 means for establishing an electric field that traverses said layer of electro-optical material by applying a potential to said electrode to vary an optical property of said electro-optical material in substantial synchronism with voltages on the conductive circuit elements;
 means for measuring said optical property in regions of said electro-optical material; and
 means responsive to said measuring means for determining a test parameter.

18. An apparatus as in claim 17, wherein said electro-optical material comprises a polymer film having a reflective coating upon one of two opposing surfaces, the coated surface of said polymer film for being urged against said circuit surface.

19. An apparatus as in claim 18, wherein said polymer is a patterned film for accommodating the contour of said circuit surface.

20. An apparatus as in claim 18, wherein the surface of the circuit is generally planar with components protruding therefrom, the polymer film having interior openings to receive operatively the components.

21. An apparatus as in claim 17 wherein said electro-optical material comprises a polymer film having a reflective coating upon one of two opposing surfaces, the polymer film for being applied to said circuit surface during manufacture of said circuit with the polymer film surface having said reflective coating being nearest said circuit surface.

22. An apparatus as in claim 21, wherein said polymer is a patterned film for accommodating the contour of said circuit surface.

23. An apparatus as in claim 21, wherein the surface of the circuit is generally planar with components protruding therefrom, the polymer film having interior openings to receive operatively the components.

24. An apparatus as in claim 17 wherein:
said circuit includes conductors corresponding to external circuit nodes, and said conductive circuit elements include conductors corresponding to internal circuit nodes;
said electro-optical material is coated with a reflective material on a surface nearest said circuit surface;
said applying means comprising means for applying a pattern of electrical test signals to said external circuit node conductors; and
said measuring means comprising:
means for directing polarized light toward selected regions of said electro-optical material through a surface thereof opposing said coated surface, said selected regions being electrically proximate said internal circuit node conductors;
means for receiving light reflecting from said selected regions; and
means for comparing the polarization of said directed light and said reflected light for each of said selected regions.

25. An apparatus as in claim 17 wherein:
said circuit includes conductors corresponding to external circuit nodes, and said conductive circuit elements include conductors corresponding to internal circuit nodes;
said electro-optical material is coated with a reflective material on two opposing surfaces, the surface nearest said circuit surface being highly reflective and the other surface being semi-transparent;
said applying means comprising means for applying a pattern of electrical test signals to said external node conductors; and
said measuring means comprising:
means for directing light toward selected regions of said electro-optical material through said semi-transparent surface, said selected regions being electrically proximate said internal node conductors;
means for receiving light emanating from said selected regions, said light being influenced by interference in said electro-optical material; and
means for measuring the luminous intensity of said emanating light for each of said selected regions.

26. An apparatus as in claim 17, wherein said electro-optical material is a polymer having electro-optically active molecules, wherein said electro-optically active molecules of said polymer within said sensor means are oriented in a direction other than normal to said circuit surface in the absence of an electric field.

27. An apparatus as in claim 26, wherein said polymer includes a first reflective face nearest said circuit surface and an opposing second face, and wherein said measuring means comprises:
means for directing polarized light toward selected regions of said electro-optical medium through said second face, in a direction substantially normal to said circuit surface;
means for receiving light reflected from said selected regions; and
means for comparing the polarization of said directed light and said reflected light for each of said selected regions.

28. An apparatus as in claim 17, wherein:
said sensor means further comprises a flexible coupling medium having a plurality of conductive channels therein terminating on first and second opposing surfaces of said coupling medium, the first surface of said coupling medium being applied to the first surface of said electro-optical material, and
the second surface of said coupling medium being placed against the circuit surface, said coupling medium being deform to conform with the circuit surface.

29. An apparatus for testing a circuit having conductive circuit elements disposed proximate a surface thereof, comprising:
sensor means having a flexible coupling medium for providing a conformable property so as operatively to expose electro-optical material in said sensor means to voltages in the circuit, said electro-optical material comprising an electro-optical crystal, and said flexible coupling medium having a plurality of conductive channels, each being insulated from the other and extending from one to the other of two opposing surfaces of said coupling medium, said coupling medium being affixed to a surface of said crystal along one of the opposing surfaces of said coupling medium, the unaffixed opposing surface of said coupling medium being for contacting said circuit surface;
means for establishing an electric field between said conductive circuit elements and an interior of said sensor means, through electro-optical material within said sensor in a direction substantially normal to said circuit surface;
means for applying test signals to said circuit;
means for measuring at selected positions within said electro-optical material an optical property of said electro-optical material influenced by said electric field, said optical property varying in substantial synchronism with signals on said conductive circuit elements; and
means responsive to said measuring means for determining a test parameter.

30. An apparatus as in claim 29, wherein the unaffixed opposing surface of said coupling medium is contoured to match the contour of said circuit surface.

31. An apparatus for testing a circuit having conductive circuit elements disposed proximate a surface thereof, comprising:

sensor means having a conformable property so as operatively to expose electro-optical material in said sensor means to voltages in the circuit;

means for establishing an electric field between said conductive circuit elements and an interior of said sensor means, through electro-optical material within said sensor in a direction substantially normal to said circuit surface;

means for applying test signals to said circuit;

means for measuring at selected positions within said electro-optical material an optical property of said electro-optical material influenced by said electric field, said optical property varying in substantial synchronism with signals on said conductive circuit elements; and means responsive to said measuring means for determining a test parameter;

wherein:

said circuit includes conductors corresponding to external circuit nodes, and said conductive circuit elements include conductors corresponding to internal circuit nodes;

said electro-optical material is provided with discrete electrodes on a surface opposite another surface nearest said circuit surface;

said applying means comprising means for applying a pattern of electrical test signals to said external circuit node conductors; and said measuring means comprises:

means for directing polarized light through one end of said electro-optical material in a direction generally parallel to the opposing surfaces thereof;

means for biassing selected ones of said electrodes; and means for receiving light from an opposing end of said electro-optical material in a selected receiver, the output thereof being indicative of an optical property at a selected region of said electro-optical material electrically proximate a nearest one of said internal circuit node conductors.

32. An apparatus for interfacing a test system to a circuit having conductive circuit elements disposed proximate a surface thereof, comprising:

a layer of electro-optical material having a reflective coating upon one of two opposing surfaces, the other surface being transparent to polarized light; and a flexible coupling medium affixed to the coated surface of said electro-optical material along one of the opposing surfaces thereof, the unaffixed opposing surface of said coupling medium being adapted to be urged against said circuit surface.

33. An apparatus as in claim 32 wherein said coupling medium comprises a flexible insulating substrate having a plurality of conductive channels, each being insulated from the other and extending from one to the other of two opposing surfaces of said coupling medium.

34. An apparatus as in claim 32 wherein the unaffixed opposing surface of said coupling medium is contoured to match the contour of said circuit surface.

35. An apparatus as in claim 32 wherein said electro-optical material is a crystal.

36. An apparatus as in claim 32 wherein said electro-optical material is a polymer film.

37. An apparatus as in claim 36 wherein the electro-optical molecules of said polymer film are oriented along a preferred direction relative to the plane of said film.

38. An apparatus as in claim 32 wherein said transparent surface is provided with a conductive layer adapted to be connected to a reference potential.

39. An apparatus as in claim 32 further comprising a convergent field lens juxtaposed adjacent said transparent surface.

40. An apparatus as in claim 32 wherein said reflective coating comprises a plurality of reflective metallic regions insulated from one another.

41. An apparatus for interfacing a polarimetric test system to a circuit having conductive circuit elements disposed proximate a surface thereof, comprising:

a layer of an electro-optical polymer having a reflective coating upon one of two opposing surfaces, said reflective coating comprising a plurality of reflective metallic regions insulated from one another, and said polymer being conformable to the circuit and having the coated surface thereof for application to the circuit surface, the other surface thereof being transparent to polarized light from the polarimetric test system; and a convergent field lens juxtaposed adjacent said transparent surface.

42. An apparatus for interfacing a polarimetric test system to a circuit having conductive circuit elements disposed proximate a surface thereof, comprising a layer of an electro-optical polymer having a reflective coating upon one of two opposing surfaces, said polymer being conformable to the circuit and having the coated surface thereof for application to the circuit surface, the other surface thereof being transparent to polarized light from the polarimetric test system and provided with a conductive layer adapted to be connected to a reference potential.

43. An apparatus for interfacing a test system to a circuit having conductive circuit elements disposed proximate a surface thereof, the apparatus comprising a layer of electro-optical material having two opposing surfaces, two opposing edge surfaces transverse to said opposing surfaces, and a plurality of discrete electrodes upon one of said two opposing surfaces and parallel to said opposing edge surfaces, the other of said opposing surfaces being adapted to be urged against said circuit surface; wherein one of said edge surfaces is for receiving polarized light along an axis parallel to said opposing surfaces, and the other of said edge surfaces is for furnishing said polarized light to a plurality of detectors.

44. An apparatus for interfacing an interferometric test system to a circuit having conductive circuit elements disposed proximate a surface thereof, comprising a layer of an electro-optical material conformable to the circuit and having a reflective coating upon two opposing surfaces, one of said coated surfaces being semi-transparent to incident polarized light, and the other of said coated surfaces being highly reflective and adapted to be applied to said circuit surface, said highly reflective coating comprises a plurality of reflective metallic regions insulated from one another.

45. An apparatus as in claim 32, further comprising a coupling medium affixed to the other surface of said electro-optical material, the unaffixed opposing surface of said coupling medium being a contoured surface adapted to match the contour of said circuit surface.

46. An apparatus as in claim 32, wherein said electro-optical material is a patterned polymer film for accommodating the contour of said circuit surface.

47. An apparatus for interfacing a polarimetric test system to a circuit having conductive circuit elements disposed proximate a surface thereof, comprising a layer of an electro-optical polymer having a reflective coating upon one of two opposing surfaces, said polymer being a patterned film for accommodating the contour of said circuit surface so as to be conformable to the circuit and having the coated surface thereof for application to the circuit surface, the other surface thereof being transparent to polarized light from the polarimetric test system.

48. An apparatus for interfacing an interferometric test system to a circuit having conductive circuit elements disposed proximate a surface thereof, comprising:
a layer of an electro-optical material conformable to the circuit and having a reflective coating upon two opposing surfaces, one of said coated surfaces being semi-transparent to incident polarized light, and the other of said coated surfaces being highly reflective and adapted to be applied to said circuit surface; and a coupling medium affixed to the other of said coated surfaces of said electro-optical material, the unaffixed opposing surface of said coupling medium being a contoured surface adapted to match the contour of said circuit surface.

49. A method for testing a circuit having conductive circuit elements disposed proximate a surface thereof, comprising the steps of:
conformably disposing an electro-optical sensor on said circuit surface;
establishing an electric field between said conductive circuit elements and an interior of said sensor, through electro-optical material within said sensor in a direction substantially normal to said circuit surface;
applying test signals to said circuit;
measuring at selected regions within said electro-optical material an optical property of said electro-optical material influenced by said electric field, said optical property being varied in substantial synchronism with signals on said conductive circuit elements; and
determining a test parameter from the results of said measuring step;
wherein said establishing step comprises the steps of:
imposing voltage levels of said conductive circuit elements on a first face of said electro-optical material; and
applying a reference potential to a transparent electrode disposed on a second face of said electro-optical material opposite said first face.

50. A method as in claim 49, wherein said first face is reflective, and wherein said measuring step comprises the steps of:
directing polarized light toward selected regions of said electro-optical material through said second face;
receiving light reflected from said selected regions; and
comparing the polarization of said directed light and said reflected light for each of said selected regions.

51. An apparatus for testing a circuit having conductive circuit elements disposed proximate a surface thereof, comprising:
sensor means having a conformable property so as operatively to expose electro-optical material in said sensor means to voltages in the circuit;
means for establishing an electric field between said conductive circuit elements and an interior of said sensor means, through electro-optical material within said sensor in a direction substantially normal to said circuit surface;
means for applying test signals to said circuit;
means for measuring at selected positions within said electro-optical material an optical property of said electro-optical material influenced by said electric field, said optical property varying in substantial synchronism with signals on said conductive circuit elements; and
means responsive to said measuring means for determining a test parameter;
wherein said establishing means comprises:
means for imposing voltage levels of said conductive circuit elements on a first face of said electro-optical material;
a transparent electrode disposed on a second face of said electro-optical material opposite said first face; and
means for applying a reference potential to said transparent electrode.

52. An apparatus as in claim 51, wherein reflective material is disposed on said first face, and wherein said measuring means comprises:
means for directing polarized light toward selected regions of said electro-optical material through said second face;
means for receiving light reflected from said selected regions; and
means for comparing the polarization of said directed light and said reflected light for each of said selected regions.

* * * * *